(12) United States Patent
Kikuchi

(10) Patent No.: US 8,227,864 B2
(45) Date of Patent: Jul. 24, 2012

(54) CMOS SEMICONDUCTOR DEVICE

(75) Inventor: Yoshiaki Kikuchi, Kanagawa (JP)

(73) Assignee: Sony Corporation (JP)

( * ) Notice: Subject to any disclaimer, the term of this patent is extended or adjusted under 35 U.S.C. 154(b) by 135 days.

(21) Appl. No.: 12/657,948

(22) Filed: Jan. 29, 2010

(65) Prior Publication Data

US 2010/0200919 A1 Aug. 12, 2010

(30) Foreign Application Priority Data

Feb. 6, 2009 (JP) ................. P2009-026674

(51) Int. Cl.
*H01L 29/66* (2006.01)
(52) U.S. Cl. ........ 257/347; 257/401; 257/532; 257/774; 257/E27.112; 257/E29.284
(58) Field of Classification Search .................. 257/519, 257/520, 618, 622, 415, 513, 347, 348, 349, 257/350, 351, E21.703, E27.112
See application file for complete search history.

(56) References Cited

U.S. PATENT DOCUMENTS

| | | | | |
|---|---|---|---|---|
| 5,675,176 | A * | 10/1997 | Ushiku et al. ................ | 257/617 |
| 6,534,831 | B2 * | 3/2003 | Kato ............................ | 257/347 |
| 6,908,821 | B2 * | 6/2005 | Kim ............................ | 438/294 |
| 7,223,640 | B2 * | 5/2007 | Pelella et al. ............... | 438/149 |
| 7,256,456 | B2 * | 8/2007 | Ohkubo et al. .............. | 257/347 |
| 7,994,577 | B2 * | 8/2011 | Shih et al. ................... | 257/355 |
| 2001/0033001 | A1 * | 10/2001 | Kato ............................ | 257/347 |
| 2003/0228722 | A1 | 12/2003 | Wristers et al. | |

FOREIGN PATENT DOCUMENTS

| | | |
|---|---|---|
| JP | 2001168338 A | 6/2001 |
| JP | 2001-284596 A | 10/2001 |
| JP | 2005079127 A | 3/2005 |
| JP | 2005536037 T | 11/2005 |
| JP | 2006041417 A | 2/2006 |
| JP | 2007042730 A | 2/2007 |
| JP | 2007242950 A | 9/2007 |

OTHER PUBLICATIONS

Office Action from Japanese Application No. 2009-026674, dated Mar. 23, 2011.

* cited by examiner

*Primary Examiner* — Zandra Smith
*Assistant Examiner* — Tsz Chiu
(74) *Attorney, Agent, or Firm* — Lerner, David, Littenberg, Krumholz & Mentlik, LLP

(57) ABSTRACT

The invention provides a semiconductor device capable of suppressing a short channel effect and fluctuation in a threshold. The semiconductor device includes: a plurality of first transistors formed in a first region in a semiconductor layer in a multilayer substrate having, on a semiconductor substrate, an insulating layer and the semiconductor layer in order from the semiconductor substrate; a plurality of second transistors formed in a second region in the semiconductor layer; a first impurity layer formed in a region opposed to the first region in the semiconductor substrate; a second impurity layer formed in a region opposed to the second region in the semiconductor substrate; and a first isolation part that isolates the first and second regions from each other and electrically isolates the first and second impurity layers from each other to a degree that at least current flowing between the first and second impurity layers is interrupted.

6 Claims, 17 Drawing Sheets

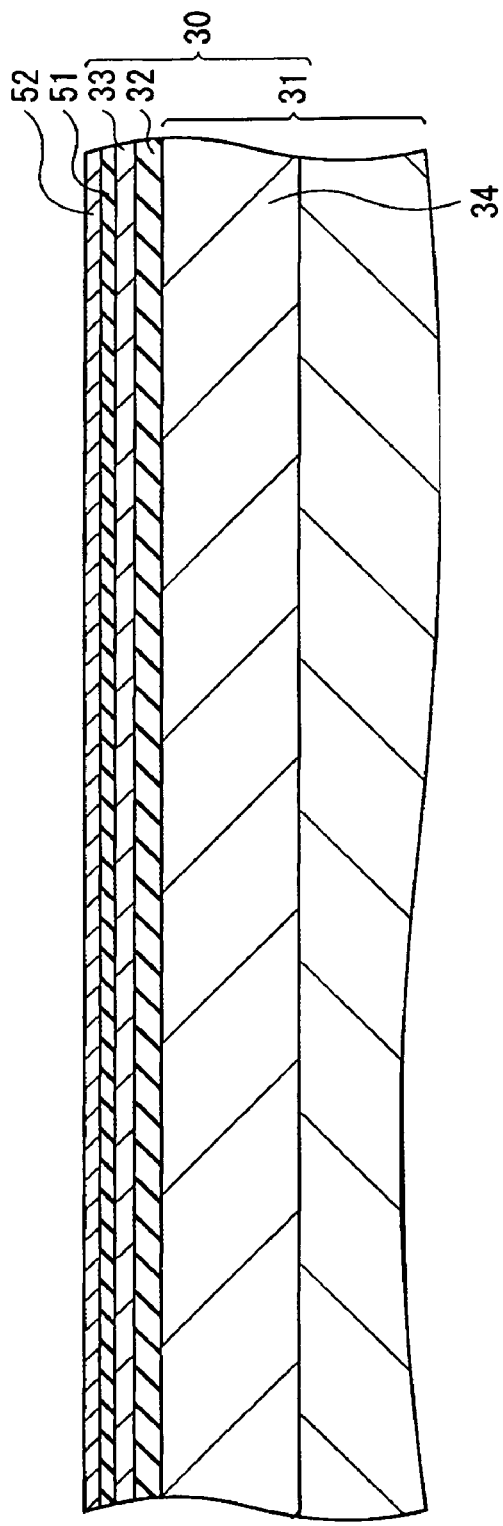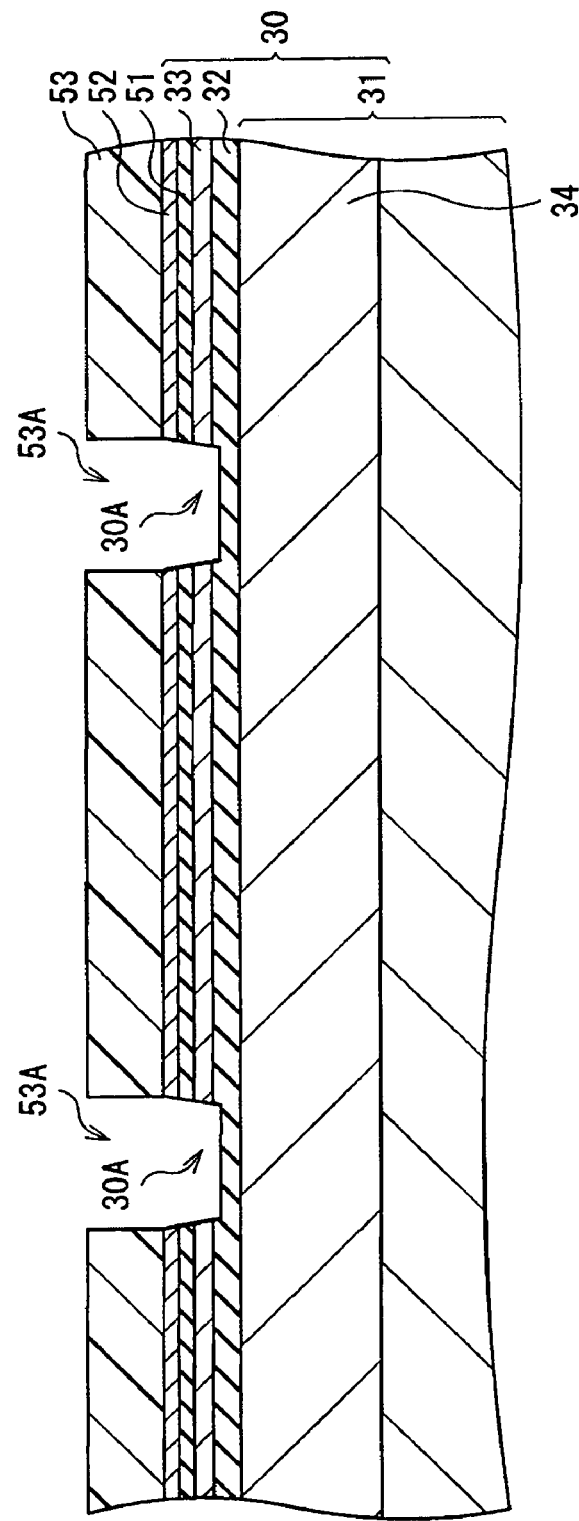
FIG. 8A
FIG. 8B

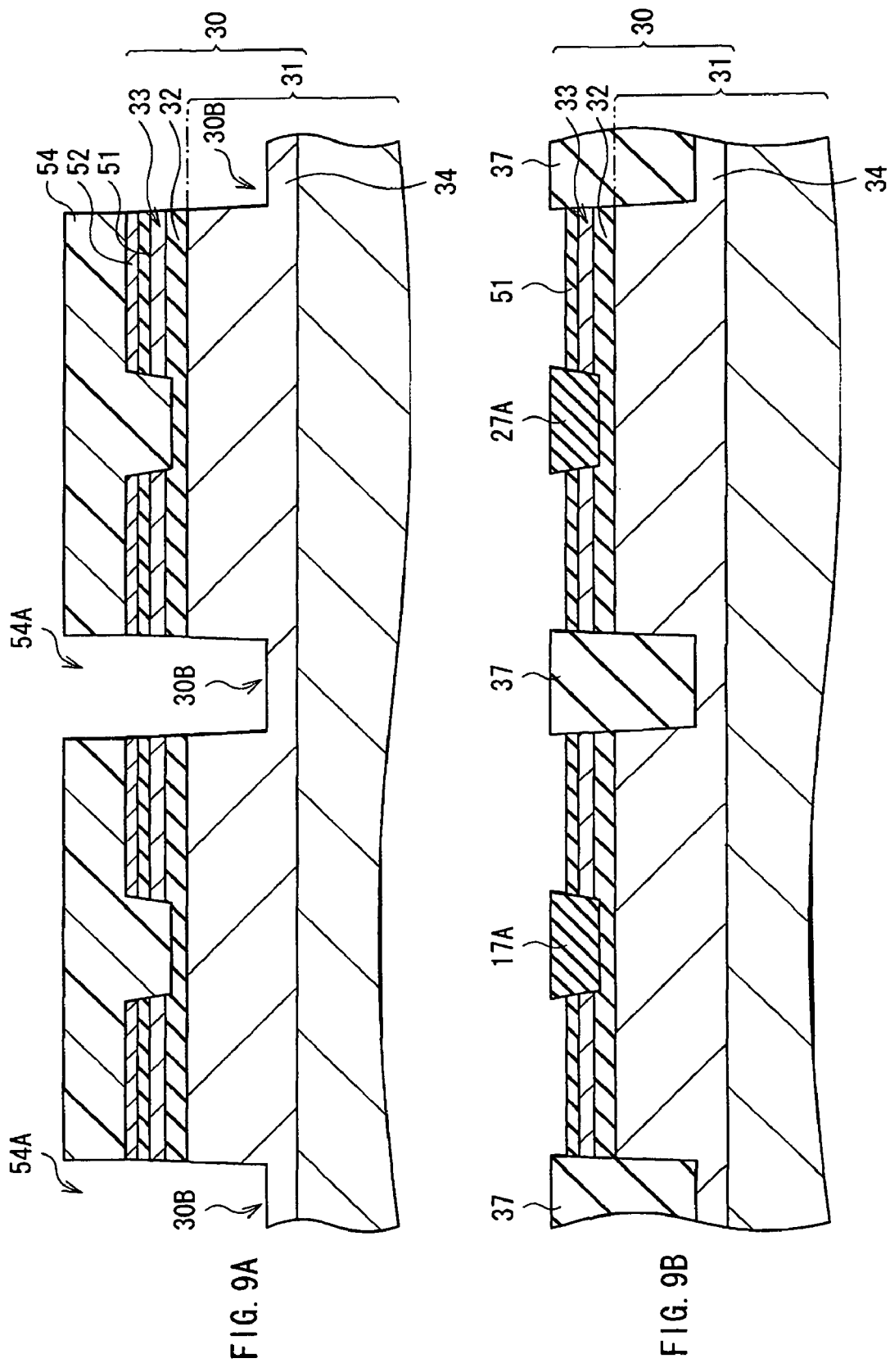

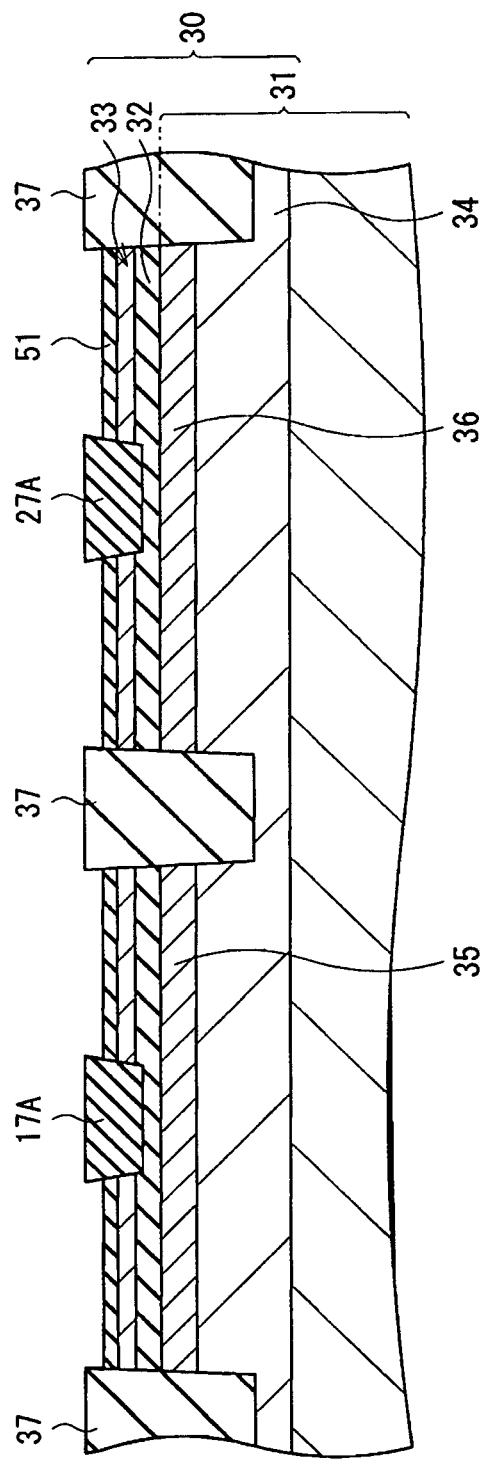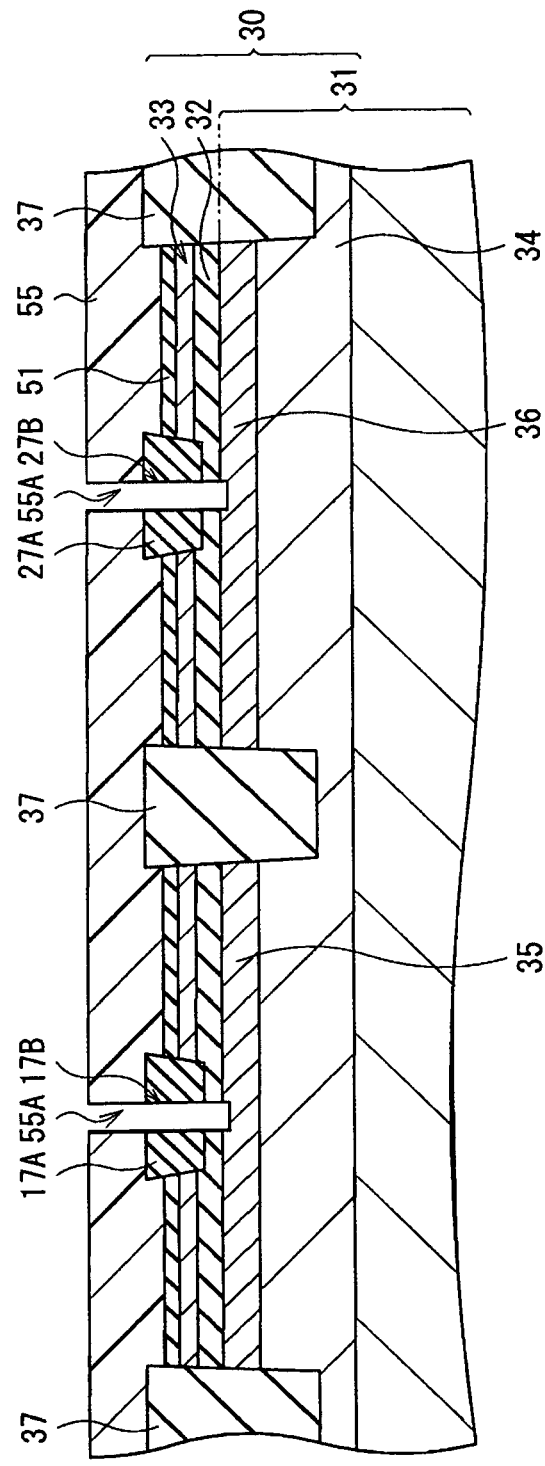

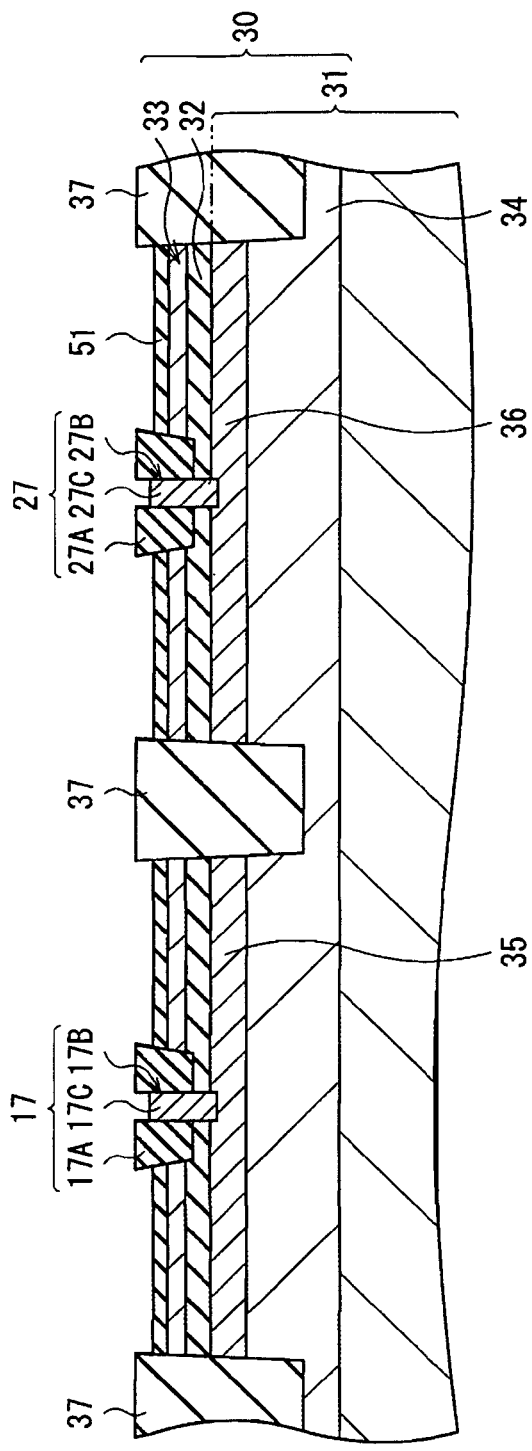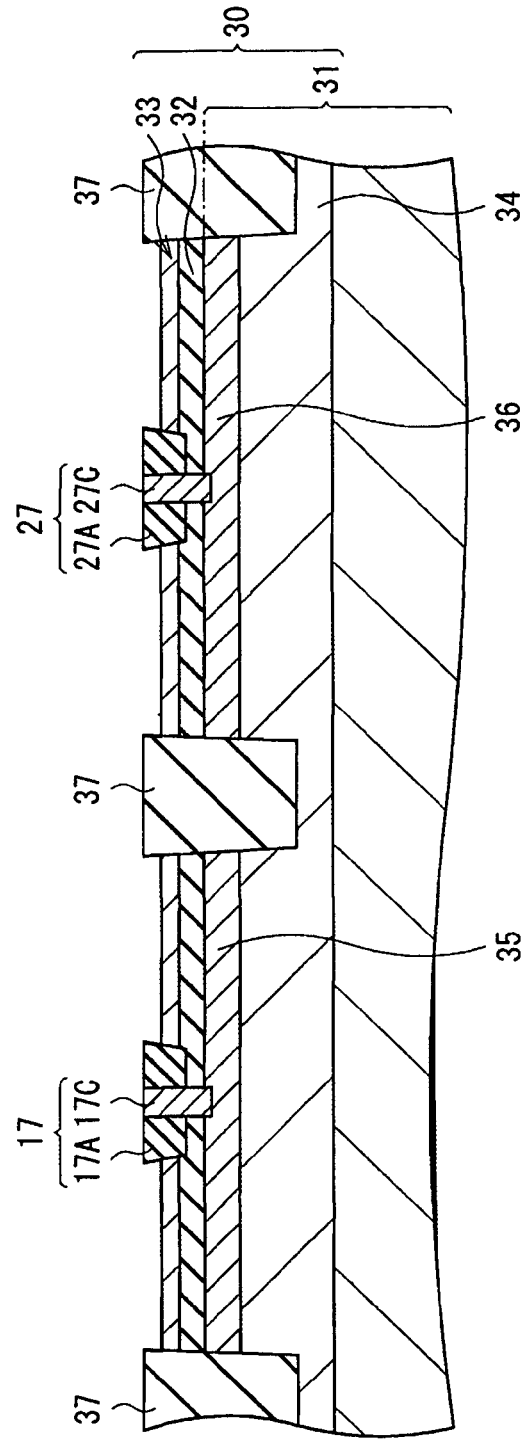

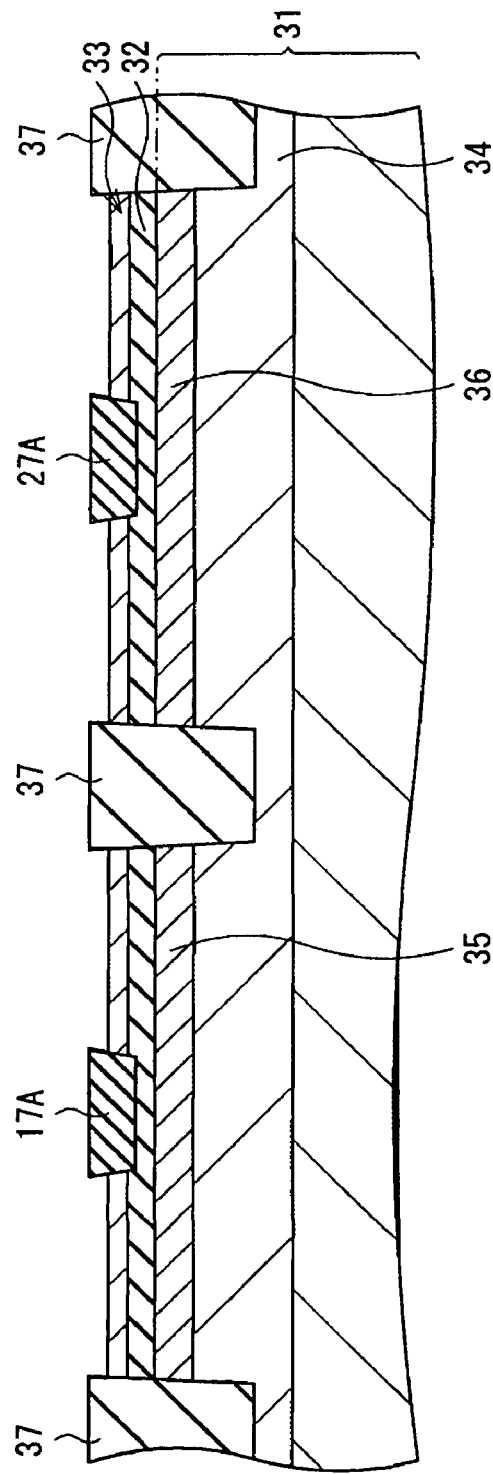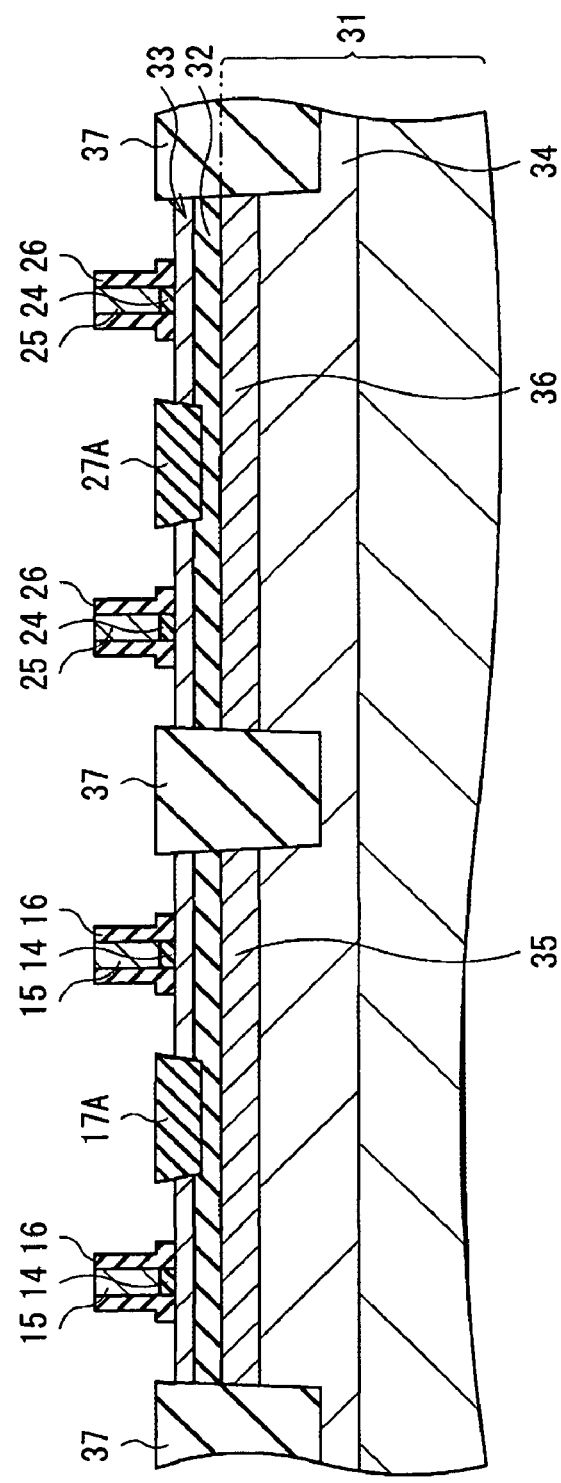
FIG. 17A
FIG. 17B

CMOS SEMICONDUCTOR DEVICE

CROSS-REFERENCE TO RELATED APPLICATION

The present application claims priority from Japanese Patent Application No. JP 2009-026674 filed in the Japanese Patent Office on Feb. 6, 2009, the entire content of which is incorporated herein by reference.

BACKGROUND OF THE INVENTION

1. Field of the Invention

The present invention relates to a semiconductor device provided with two kinds of transistors of different conduction types on an insulting layer.

2. Description of the Related Art

With shortening of gate length, the operation speed of a MOS (Metal Oxide Semiconductor) transistor is increasing. However, power consumption also increases, and a phenomenon that total performance of an integrated circuit becomes lower than that of an existing integrated circuit is conspicuous. The phenomenon is called the short channel effect. It is extremely important to suppress the effect as much as possible in order to realize a high-performance low-power-consumption integrated circuit. However, the short channel effect increases as the ratio of a transverse electric field to a vertical electric field increases. Consequently, when MOS transistors are formed in bulk silicon crystal, it is extremely difficult to suppress the short channel effect.

In recent years, attention is being paid to a technique of forming MOS transistors in a single-crystal silicon layer on an insulator layer (SOI (Silicon on Insulator) layer) (see Japanese Examined Patent Application Publication No. 2001-284596). In the technique, by thinning the SOI layer, the transverse electric field is made smaller. Further, by forming a high-concentration impurity layer just below the SOI layer and using the impurity layer as a back gate, the vertical electric field is increased. Therefore, it is said that the technique is very promising from the viewpoint of suppressing the short channel effect.

SUMMARY OF THE INVENTION

MOS transistors include a p-channel-type MOS transistor (p-type MOS transistor) and an n-channel-type MOS transistor (n-type MOS transistor). There is a case that the p-type and n-type MOS transistors are formed adjacent to each other on a semiconductor substrate. For example, in an SRAM (Static Random Access Memory), one memory cell is constructed by two p-type MOS transistors and two n-type MOS transistors. The p-type MOS transistor and the n-type MOS transistor are formed adjacent to each other in a memory cell.

In the case where the p-type MOS transistor and the n-type MOS transistor are adjacent to each other as described above, for the purpose of suppressing the short channel effect, it is considered to form both of the transistors in the SOI and provide both of the transistors with back gates. In relation with the threshold of a gate voltage, it is necessary to use an n-type impurity layer as the back gate of the p-type MOS transistor, apply positive voltage to the n-type impurity layer, use a p-type impurity layer as the back gate of the n-type MOS transistor, and apply negative voltage to the p-type impurity layer. However, in this case, current easily flows between the back gate of the p-type MOS transistor and the back gate of the n-type MOS transistor. When the current (leak current) value increases, the voltage of the back gate drops more than a desired value. In the case where the voltage drop in the back gate varies among the transistors, the characteristics of the transistors vary among the transistors. When the voltage of the back gate drops (becomes close to zero volt), the threshold decreases, and the effect of suppressing the short channel effect decreases.

It is therefore desirable to provide a semiconductor device capable of suppressing both the short channel effect and fluctuation in the threshold.

According to an embodiment of the invention, there is provided a semiconductor device including a plurality of first transistors and a plurality of second transistors on a multilayer substrate having, on a semiconductor substrate, an insulating layer and a semiconductor layer in order from the semiconductor substrate. The first transistors are formed in a first region in the semiconductor layer, and the second transistors are formed in a second region in the semiconductor layer. A first impurity layer is formed in a region opposed to the first region in the semiconductor substrate, and a second impurity layer is formed in a region opposed to the second region in the semiconductor substrate. A first isolation part is formed between the first and second regions. The first isolation part isolates the first and second regions from each other and electrically isolates the first and second impurity layers from each other to a degree that at least current flowing between the first and second impurity layers is interrupted.

In the semiconductor device of an embodiment of the invention, a structure capable of applying voltage from the outside to the first and second impurity layers may be provided. In the case where such a structure is provided in the semiconductor device as an embodiment of the invention, when the first and second transistors are, for example, MOS transistors, the first and second impurity layers function as second gates (back gates).

The semiconductor device of an embodiment of the invention is provided with the first isolation part that isolates the first and second regions from each other and electrically isolates the first and second impurity layers from each other to a degree that at least current flowing between the first and second impurity layers is interrupted. With the configuration, when the first and second impurity layers are used as back gates, flow of current between the back gate of the first transistor and the back gate of the second transistor is suppressed.

According to the semiconductor device of an embodiment of the invention, when the first and second impurity layers are used as back gates, flow of current between the back gate of the first transistor and the back gate of the second transistor is suppressed. As a result, a voltage drop amount in the back gate is decreased, so that both the short channel effect and fluctuation in the threshold are suppressed.

Other and further objects, features and advantages of the invention will appear more fully from the following description.

BRIEF DESCRIPTION OF THE DRAWINGS

FIGS. 8A and 8B are cross sections for explaining a process of manufacturing the semiconductor device of FIG. 1.

FIGS. 9A and 9B are cross sections for explaining a manufacturing process subsequent to FIG. 8B.

FIGS. 10A and 10B are cross sections for explaining a manufacturing process subsequent to FIG. 9B.

FIGS. 11A and 11B are cross sections for explaining a manufacturing process subsequent to FIG. 10B.

FIGS. 17A and 17B are cross sections for explaining a manufacturing process of a modification of the semiconductor device of FIG. 1.

DETAILED DESCRIPTION OF THE PREFERRED EMBODIMENTS

Best modes for carrying out the invention will be described in detail below with reference to the drawings. The description will be given in the following order.

1. Embodiment (a semiconductor device having two kinds of MOS transistors)
2. Application Example (a semiconductor device having an SRAM)
3. Modification

EMBODIMENT

Figure 1:
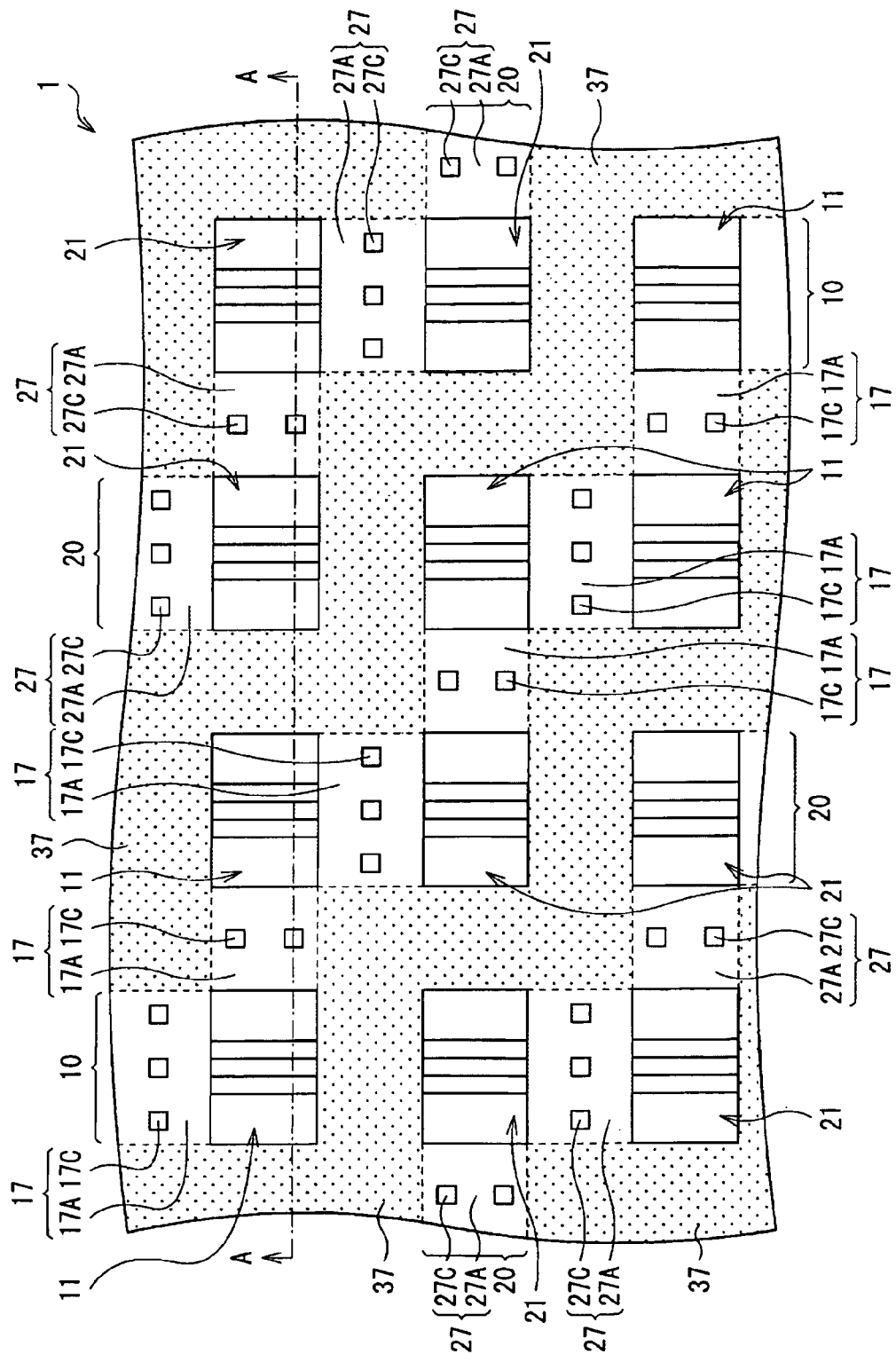
FIG. 1 is a top configuration diagram of a semiconductor device according to an embodiment of the present invention.

FIG. 1 illustrates an example of a top-view configuration of a semiconductor device 1 according to an embodiment of the present invention. The semiconductor device 1 is an integrated circuit in which a plurality of transistors are integrated. The semiconductor device 1 has, for example, as illustrated in FIG. 1, a first region 10 in which a plurality of p-type MOS transistors 11 are integrated and a second region 20 in which a plurality of n-type MOS transistors 21 are integrated.

Layout

The plurality of p-type MOS transistors 11 are formed in a series at a predetermined pitch in a direction in a plane. A plurality of series exist and are disposed in parallel with predetermined gaps in between. The first region 10 exists in correspondence with each series. Concretely, the first region 10 is a band-shaped region extending in the direction where the p-type MOS transistors 11 exist in series. The first regions 10 are disposed in parallel with predetermined gaps in between. In each first region 10, one or more isolation parts 17 (which will be described later) are formed between neighboring p-type MOS transistors 11. The p-type MOS transistor 11 of the embodiment corresponds to a concrete example of a "first transistor" of the present invention.

The plurality of n-type MOS transistors 21 are formed in series at a predetermined pitch in a direction in the plane, concretely, in a direction parallel to the direction where the p-type MOS transistors 11 exist in series. A plurality of series exist and are disposed in parallel with predetermined gaps in between. The second region 20 exists in correspondence with each series. Concretely, the second region 20 is a band-shaped region extending in the direction where the p-type MOS transistors 21 exist in series. The second regions 20 are disposed in parallel with predetermined gaps in between. In each second region 20, one or more isolation parts 27 (which will be described later) are formed between neighboring n-type MOS transistors 21. The n-type MOS transistor 21 of the embodiment corresponds to a concrete example of a "second transistor" of the present invention.

The first and second regions 10 and 20 may be disposed alternately line by line as illustrated in FIG. 1 or, although not illustrated, may be disposed alternately lines by lines. The first and second regions 10 and 20 may extend in a zig-zag manner as illustrated in FIG. 1 or, although not illustrated, may extend linearly. In any case, a band-shaped isolation part 37 (which will be described later) isolating between the first and second regions 10 and 20 is formed between the first and second regions 10 and 20.

Sectional Configuration

Multilayer Substrate 30

Figure 2:
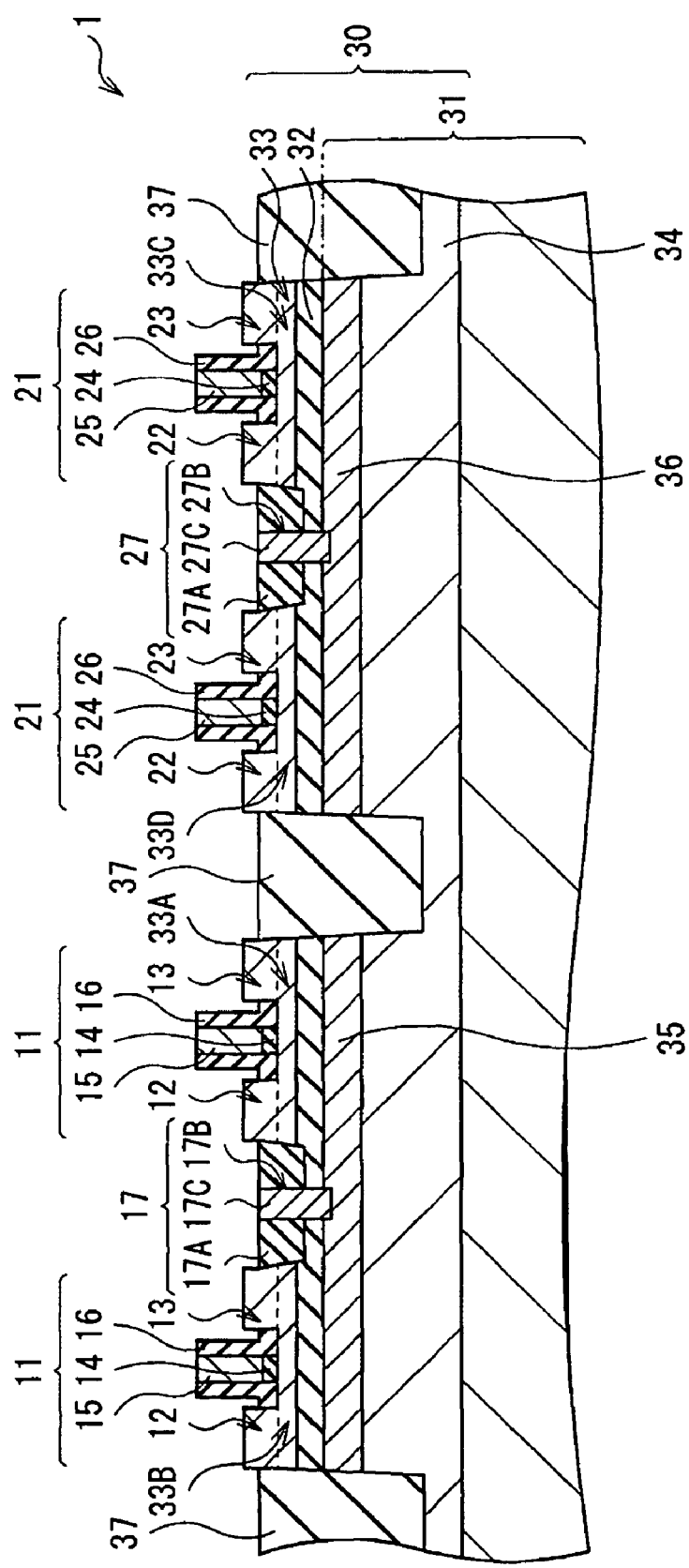
FIG. 2 is a sectional configuration diagram taken along line A-A of the semiconductor device of FIG. 1.

FIG. 2 illustrates an example of a sectional configuration taken along line A-A of FIG. 1. The semiconductor device 1 is formed by, for example, as illustrated in FIG. 2, integrating a number of MOS transistors on a multilayer substrate 30 having, on a semiconductor substrate 31, an insulating layer 32 and a semiconductor layer in order from the semiconductor substrate 31. The multilayer substrate 30 is formed by injecting oxygen ions into the surface of the semiconductor substrate. Therefore, the insulating layer 32 corresponds to a so-called buried insulating layer, and the semiconductor layer 33 is the surface layer of the semiconductor substrate, which is formed on the buried insulating layer accompanying formation of the buried insulating layer.

The semiconductor substrate 31 is a single-crystal substrate, and the semiconductor layer 33 is a semiconductor layer mainly containing the same single crystal as that of the semiconductor substrate 31 (single-crystal semiconductor layer). An example of the single-crystal substrate is a single-crystal silicon substrate. An example of the single-crystal semiconductor layer is a single-crystal silicon layer. In the case where the semiconductor layer 33 mainly contains single-crystal silicon, the semiconductor layer 33 corresponds to a so-called SOI layer. The thickness of the SOI layer is, preferably, for example, 4 nm to 20 nm both inclusive from the viewpoint of decreasing the electric field in the lateral direction in the SOI layer. In the case where the semiconductor substrate 31 and the semiconductor layer 33 mainly contain single-crystal silicon, the insulating layer 32 mainly contains silicon oxide ($SiO_2$). In the case where the insulating layer 32 mainly contains an oxide, the insulating layer 32 corresponds to a so-called BOX (Buried Oxide) layer. The thickness of the BOX layer is preferably a thickness in which the electric field in the thickness direction (the vertical direction) in the semiconductor layer 33 may be controlled (increased) when voltage is applied to impurity layers 35 and 36 and is, for example, 10 nm to 30 nm both inclusive.

The semiconductor substrate 31 contains, mainly, for example, n-type impurity in a part excluding the regions in which a deep-well layer 34 and the impurity layers 35 and 36 which will be described later are formed. The semiconductor layer 33 contains mainly impurity according to the kind of a transistor formed on the semiconductor layer 33. For example, in the region in which the p-type MOS transistor 11 is formed in the semiconductor layer 33, a large amount of p-type impurity is doped. The region functions as a channel region of the p-type MOS transistor 11. In the region in which the n-type MOS transistor 21 is formed in the semiconductor layer 33, a large amount of n-type impurity is doped. The region functions as a channel region of the n-type MOS transistor 21.

Deep-Well Layer 34

Figure 3:
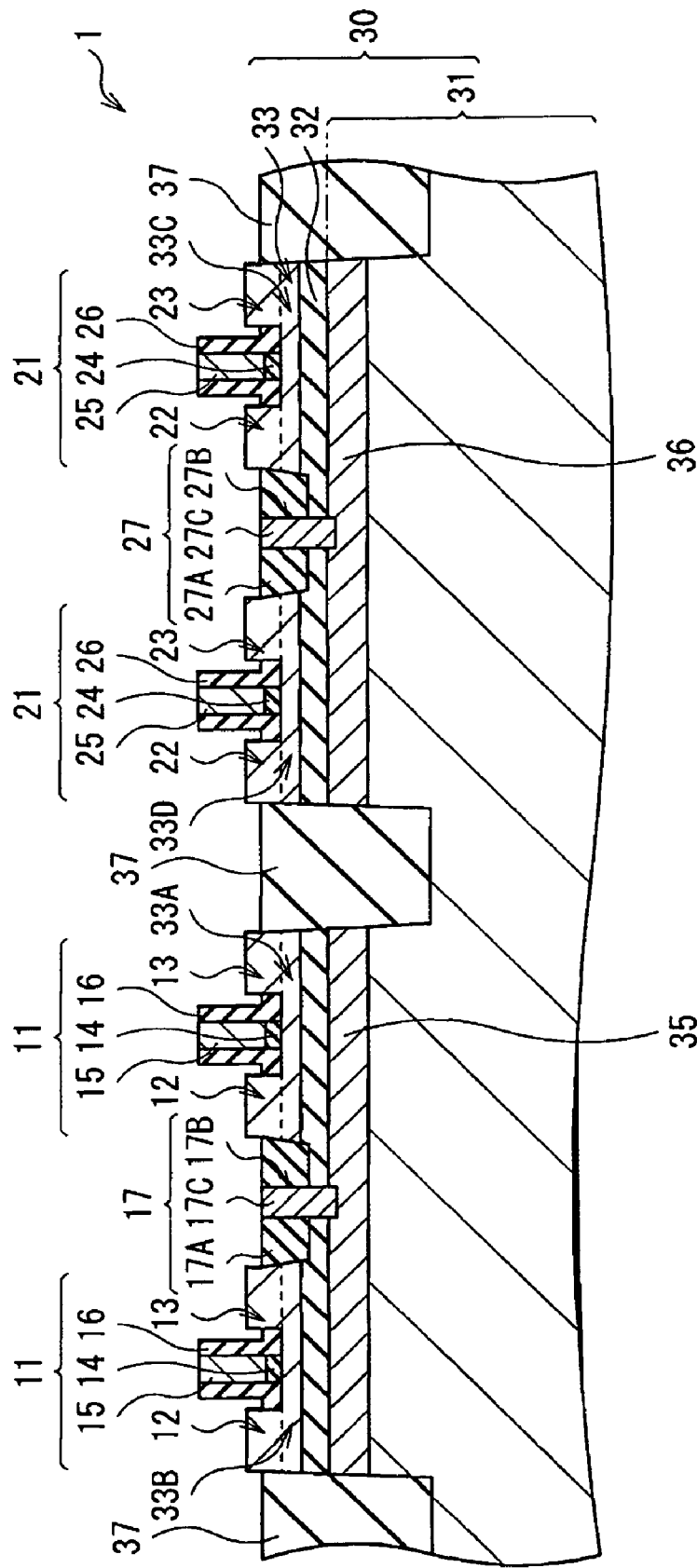
FIG. 3 is a sectional configuration diagram illustrating a first modification of the semiconductor device of FIG. 1.

The semiconductor substrate 31 has, for example, as illustrated in FIG. 2, the deep-well layer 34 formed deeply in the surface of the semiconductor substrate 31. The deep-well layer 34 contains mainly impurity of a conduction type (for example, p-type) different from that of the semiconductor substrate 31. The semiconductor substrate 31 may not have the deep-well layer 34 as necessary, for example, as illustrated in FIG. 3. In this case, the semiconductor substrate 31 contains mainly impurity of a conduction type (for example, p-type) different from the above-described conduction type in a part excluding the regions in which the impurity layers 35 and 36 are formed.

Impurity Layers 35 and 36

The semiconductor substrate 31 has, for example, as illustrated in FIG. 2, the impurity layers 35 and 36 in the surface of the semiconductor substrate 31, that is, just below the insulating layer 32. The impurity layer 35 is formed in a region (just below the p-type MOS transistor 11) opposed to the first region 10, and the impurity layer 36 is formed in a region (just below the n-type MOS transistor 21) opposed to the second region 20. The impurity layer 35 of the embodiment corresponds to a concrete example of a "first impurity layer" of the present invention, and the impurity layer 36 corresponds to a concrete example of a "second impurity layer" of the present invention.

The impurity layer 35 functions as a second gate (back gate) of the p-type MOS transistor 11. The impurity layer 35 contains, in high concentration, impurity of a conduction type different from that just below the impurity layer 35 in the semiconductor substrate 31. For example, as illustrated in FIG. 2, in the case where the deep-well layer 34 is formed just below the impurity layer 35, impurity of a conduction type (for example, n type) different from that of the deep-well layer 34 is contained. In the case where the impurity layer such as the deep-well layer 34 is not formed just below the impurity layer 35, impurity of the conduction type (for example, n type) different from that of the part excluding the region in which the impurity layers 35 and 36 are formed in the semiconductor substrate 31 is contained in high concentration.

The impurity layer 36 functions as a second gate (back gate) of the n-type MOS transistor 21. The impurity layer 36 contains impurity of the same conduction type as that of the part just below the impurity layer 36 in the semiconductor substrate 31 in high concentration. For example, as illustrated in FIG. 2, in the case where the deep-well layer 34 is formed just below the impurity layer 36, the impurity layer 36 contains impurity of the same conduction type (for example, p-type) as that of the deep-well layer 34 in high concentration. In the case where an impurity layer such as the deep-well layer 34 is not formed just below the impurity layer 36, the impurity layer 36 contains, in high concentration, impurity of the same conduction type (for example, p-type) as that of the conduction type of the part excluding the regions in which the impurity layers 35 and 36 are formed in the semiconductor substrate 31.

p-Type MOS Transistor 11

As described above, in the first region 10, the plurality of p-type MOS transistors 11 are integrated. The p-type MOS transistor 11 is formed on the semiconductor layer 33, for example, as illustrated in FIG. 2. The p-type MOS transistor 11 has semiconductor layers 12 and 13 functioning as the source or drain, a gate insulting film 14, a gate electrode 15, and a sidewall 16.

The semiconductor layers 12 and 13 are formed on both sides of the gate electrode 15 and disposed so as to face each other with the gate electrode 15 in between. The semiconductor layers 12 and 13 are semiconductor layers (single-crystal semiconductor layers) containing mainly the same single crystal as that of the semiconductor layer 33. The semiconductor layers 12 and 13 contain, for example, impurity of the same conduction type (p type) as that of the conduction type in the part opposite to the first region 10 in the semiconductor layer 33. The gate insulating film 14 is made of, for example, a high-permittivity oxide (Hf-based oxide film) or silicon oxide ($SiO_2$). The gate electrode 15 is made of, for example, a metal material (TiN, HfSi, or the like) or a polysilicon layer. The side wall 16 is provided for space separation between the gate electrode 15 and the semiconductor layers 12 and 13 and is formed on both side faces of the gate electrode 15. The side wall 16 is made of, for example, a silicon-based insulating material and has a single-layer structure of silicon nitride (SiN) or silicon oxide ($SiO_2$) or a multilayer structure obtained by stacking those materials.

Isolation Part 17

As described above, in the first region 10, a plurality of isolation parts 17 are formed. The isolation part 17 of the embodiment corresponds to a concrete example of a "second isolation part" of the present invention. The isolation part 17 is formed between the p-type MOS transistors 11 adjacent to each other. The isolation part 17 is formed, for example, as illustrated in FIGS. 1 and 2, between the semiconductor layer 12 of a certain p-type MOS transistor 11 and the semiconductor layer 13 of another p-type MOS transistor 11 adjacent to the certain p-type MOS transistor 11 and provides space isolation between the semiconductor layers and 13. Further, the isolation part 17 space-isolates a part just below the semiconductor layer 12 of the certain p-type MOS transistor 11 in the semiconductor layer 33 and a part just below the semiconductor layer 13 of the adjacent another p-type MOS transistor 11 in the semiconductor layer 33. That is, the isolation part 17 provides insulating isolation between a channel region 33A in the certain p-type MOS transistor 11 and a channel region 33B in the another p-type MOS transistor 11.

Figure 4:
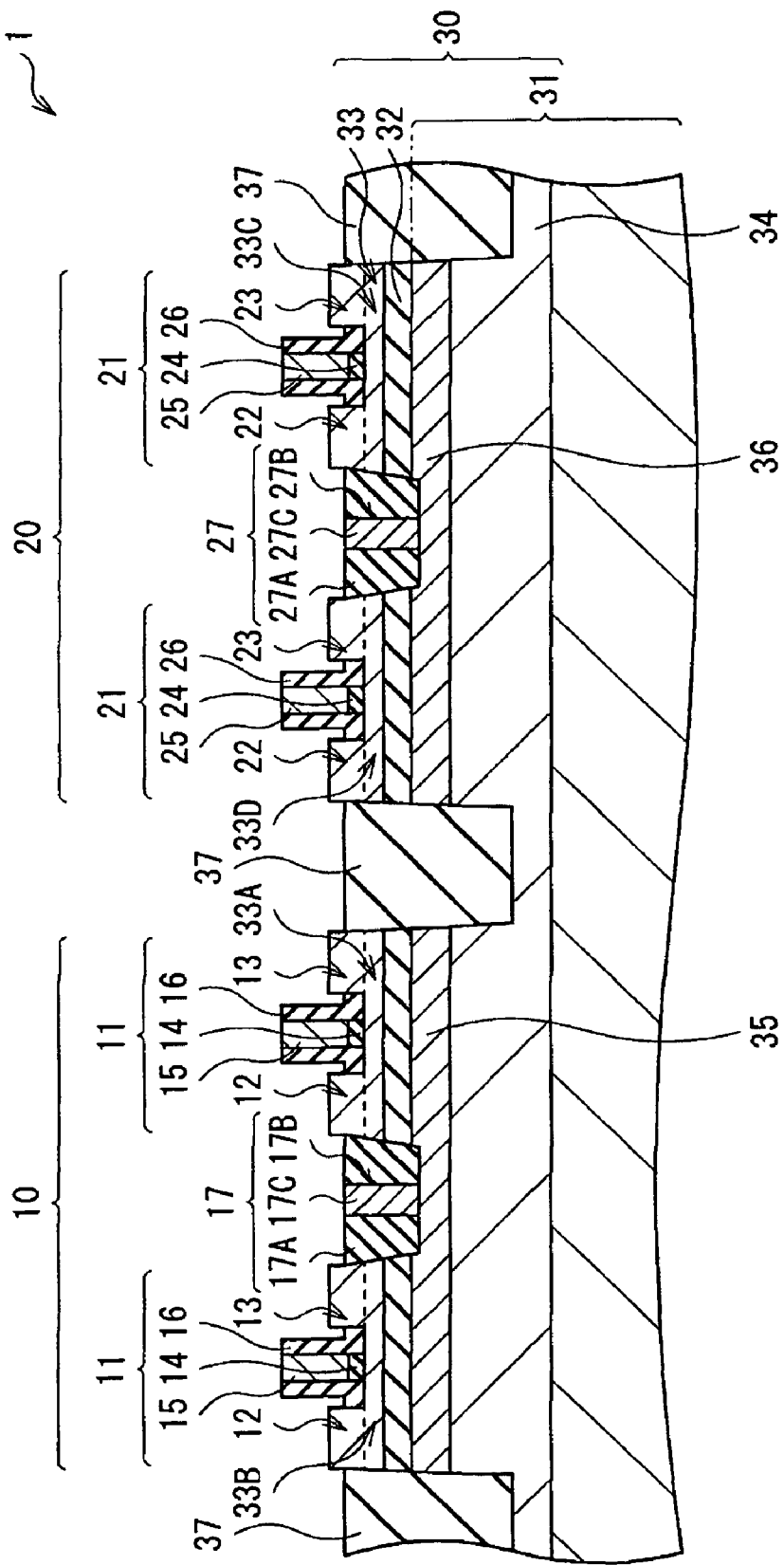
FIG. 4 is a sectional configuration diagram illustrating a second modification of the semiconductor device of FIG. 1.

The isolation part 17 has, for example, as illustrated in FIG. 2, a shallow STI (Shallow Trench Isolation) structure and has an insulation part 17A made of, for example, silicon oxide ($SiO_2$). The insulation part 17A penetrates the semiconductor layer 33 but does not penetrate the impurity layer 35, and the bottom of the insulation part 17A is formed, for example, as illustrated in FIG. 2, near the top face of the insulating layer 32. That is, the insulation part 17A does not have action of increasing a resistance component in the part just below the isolation part 17 in the impurity layer 35. The insulation part 17A may penetrate, for example, as illustrated in FIG. 4, not only the semiconductor layer 33 but also the insulating layer 32 and its bottom part may be formed near the top face of the impurity layer 35.

The insulation part 17A has a through hole 17B penetrating in the layer stack direction. The isolation part 17 has a conduction part 17C (first conduction part) formed at least in the through hole 17B and electrically connected to the impurity layer 35. The conduction part 17C contains, for example, polysilicon containing, in high concentration, impurity of the same conduction type (n type) as that of the impurity layer 35. With the configuration, voltage may be applied from the outside to the impurity layer 35 via the conduction part 17C.

The through hole 17B in the embodiment corresponds to a concrete example of a "first through hole" of the present invention, and the conduction part 17C corresponds to a concrete example of a "first conduction part" of the invention.

n-Type MOS TRANSISTOR 21

As described above, in the second region 20, a plurality of n-type MOS transistors 21 are integrated. The n-type MOS transistors 21 are formed, for example, as illustrated in FIG. 2, over the semiconductor layer 33. The n-type MOS transistor 21 has semiconductor layers 22 and 23 functioning as source or drain, a gate insulating film 24, a gate electrode 25, and a side wall 26.

The semiconductor layers 22 and 23 are formed on both sides of the gate electrode 25 and disposed so as to face each other with the gate electrode 25 in between. The semiconductor layers 22 and 23 are semiconductor layers (single-crystal semiconductor layers) containing mainly the same single crystal as that of the semiconductor layer 33. The semiconductor layers 22 and 23 contain, for example, impurity of the same conduction type (n type) as that of the conduction type in the part opposite to the second region 20 in the semiconductor layer 33. The gate insulating film 24 is made of a silicon oxide ($SiO_2$). The gate electrode 25 has a two-layer structure in which, for example, a polysilicon layer containing, in high concentration, impurity of the same conduction type (n type) as that of the part opposed to the second region 20 in the semiconductor layer 33 and a silicide layer are stacked in order from the gate insulating film 24 side. The side wall 26 is provided for space isolation between the gate electrode 25 and the semiconductor layers 22 and 23 and is formed on both side faces of the gate electrode 25. The side wall 26 is made of, for example, a silicon-based insulating material and has a single-layer structure of silicon nitride (SiN) or silicon oxide ($SiO_2$) or a multilayer structure obtained by stacking those materials.

Isolation Part 27

As described above, in the second region 20, a plurality of isolation parts 27 are formed. The isolation part 27 of the embodiment corresponds to a concrete example of a "third isolation part" of the present invention. The isolation part 27 is formed between the n-type MOS transistors 21 adjacent to each other. The isolation part 27 is formed, for example, as illustrated in FIGS. 1 and 2, between the semiconductor layer 22 of a certain p-type MOS transistor 21 and the semiconductor layer 23 of another n-type MOS transistor 21 adjacent to the certain n-type MOS transistor 21 and provides space isolation between the semiconductor layers and 23. Further, the isolation part 27 space-isolates a part just below the semiconductor layer 22 of the certain n-type MOS transistor 21 in the semiconductor layer 33 and a part just below the semiconductor layer 23 of the adjacent another n-type MOS transistor 21 in the semiconductor layer 33. That is, the isolation part 27 provides insulating isolation between a channel region 33C in the certain n-type MOS transistor 21 and a channel region 33D in the another n-type MOS transistor 21.

The isolation part 27 has, for example, as illustrated in FIG. 2, a shallow STI structure and has an insulation part 27A made of, for example, silicon oxide ($SiO_2$). The insulation part 27A penetrates the semiconductor layer 33 but does not penetrate the impurity layer 35, and its bottom is formed, for example, as illustrated in FIG. 2, near the top face of the insulating layer 32. That is, the insulation part 27A does not have action of increasing a resistance component in the part just below the isolation part 27 in the impurity layer 36. The insulation part 27A may penetrate, for example, as illustrated in FIG. 4, not only the semiconductor layer 33 but also the insulating layer 32 and its bottom part may be formed near the top face of the impurity layer 36.

The insulation part 27A has a through hole 27B penetrating in the layer stack direction. The isolation part 27 has a conduction part 27C (second conduction part) formed at least in the through hole 27B and electrically connected to the impurity layer 36. The conduction part 27C contains, for example, polysilicon containing, in high concentration, impurity of the same conduction type (p type) as that of the impurity layer 36. With the configuration, voltage is applied from the outside to the impurity layer 36 via the conduction part 27C. The through hole 27B in the embodiment corresponds to a concrete example of a "second through hole" of the present invention, and the conduction part 27C corresponds to a concrete example of a "second conduction part" of the invention.

Isolation Part 37

As described above, between the first and second regions 10 and 20, the band-shaped isolation part 37 is formed. The isolation part 37 of the embodiment corresponds to a concrete example of a "first isolation part" of the present invention. The isolation part 37 isolates between the first and second regions 10 and 20. The isolation part 37 is formed, for example, as illustrated in FIGS. 1 and 2, between the semiconductor layers 12 and 13 of the p-type MOS transistor 11 and the semiconductor layers 22 and 23 of the n-type MOS transistor 21 adjacent to the p-type MOS transistor and provides space isolation between them. Further, the isolation part 37 space-isolates a part just below the semiconductor layers 12 and 13 of the certain p-type MOS transistor 11 in the semiconductor layer 33 and a part just below the semiconductor layers 22 and 23 of the adjacent another n-type MOS transistor 21 in the semiconductor layer 33. That is, the isolation part 37 provides insulating isolation between channel regions 33A and 33B in the p-type MOS transistor 11 and the channel regions 33C and 33D in the n-type MOS transistor 21.

The isolation part 37 has, for example, as illustrated in FIG. 2, a deep STI structure and is made of, for example, silicon oxide ($SiO_2$). The insulation part 37 has a structure of obtaining electric isolation to a degree that current (leak current) flowing between the impurity layers 35 and 36 is interrupted. The isolation part 37 penetrates, for example, as illustrated in FIG. 2, layers including the semiconductor layer 33, the insulating layer 32, and the impurity layers 35 and 36. The insulation part 37 electrically isolates between the impurity layers 35 and 36 so that leak current becomes, for example, 100 nA/μm or less.

The impurity layers 35 and 36 have, usually, a concentration distribution in the thickness direction. It is assumed that whether the isolation part 37 penetrates layer including the impurity layers 35 and 36 or not is determined by, for example, whether the isolation part 37 penetrates a part having impurity concentration of 1/e (e denotes a logarithm natural) of the peak value of impurity concentration of the impurity layers 35 and 36 or not.

Figure 5:
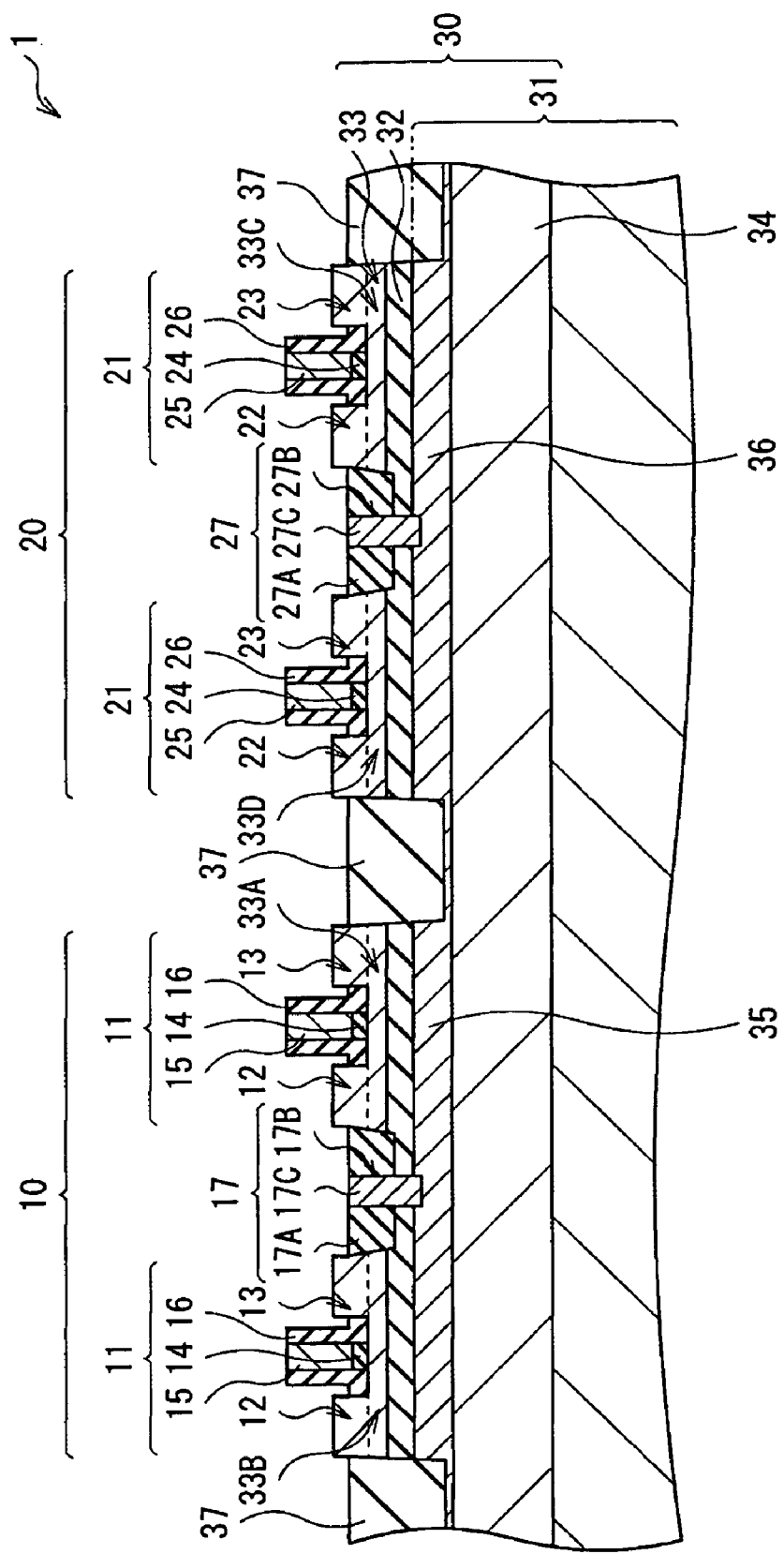
FIG. 5 is a sectional configuration diagram illustrating a third modification of the semiconductor device of FIG. 1.
Figure 6:
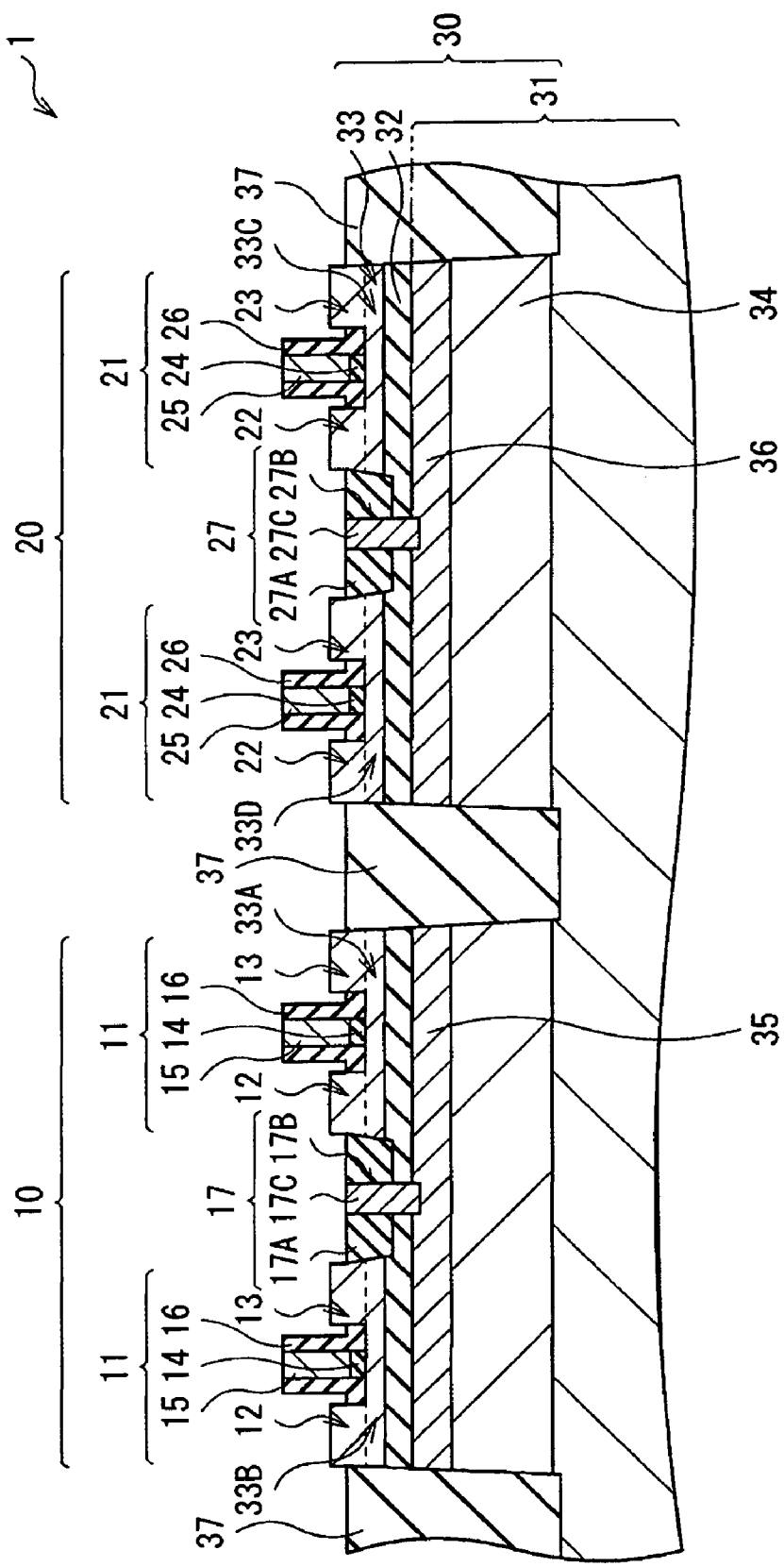
FIG. 6 is a sectional configuration diagram illustrating a fourth modification of the semiconductor device of FIG. 1.

For example, as illustrated in FIG. 5, at a limit in which the leak current becomes the above-described value or less, the bottom of the isolation part 37 may be formed in the layer including the impurity layers 35 and 36. That is, the isolation part 37 may not penetrate the layer including the impurity layers 35 and 36. In the case where the deep-well layer 34 is formed in the semiconductor substrate 31, the isolation part 37 may, for example, as illustrated in FIG. 6, penetrate the deep-well layer 34.

Lead Wires

Figure 7:
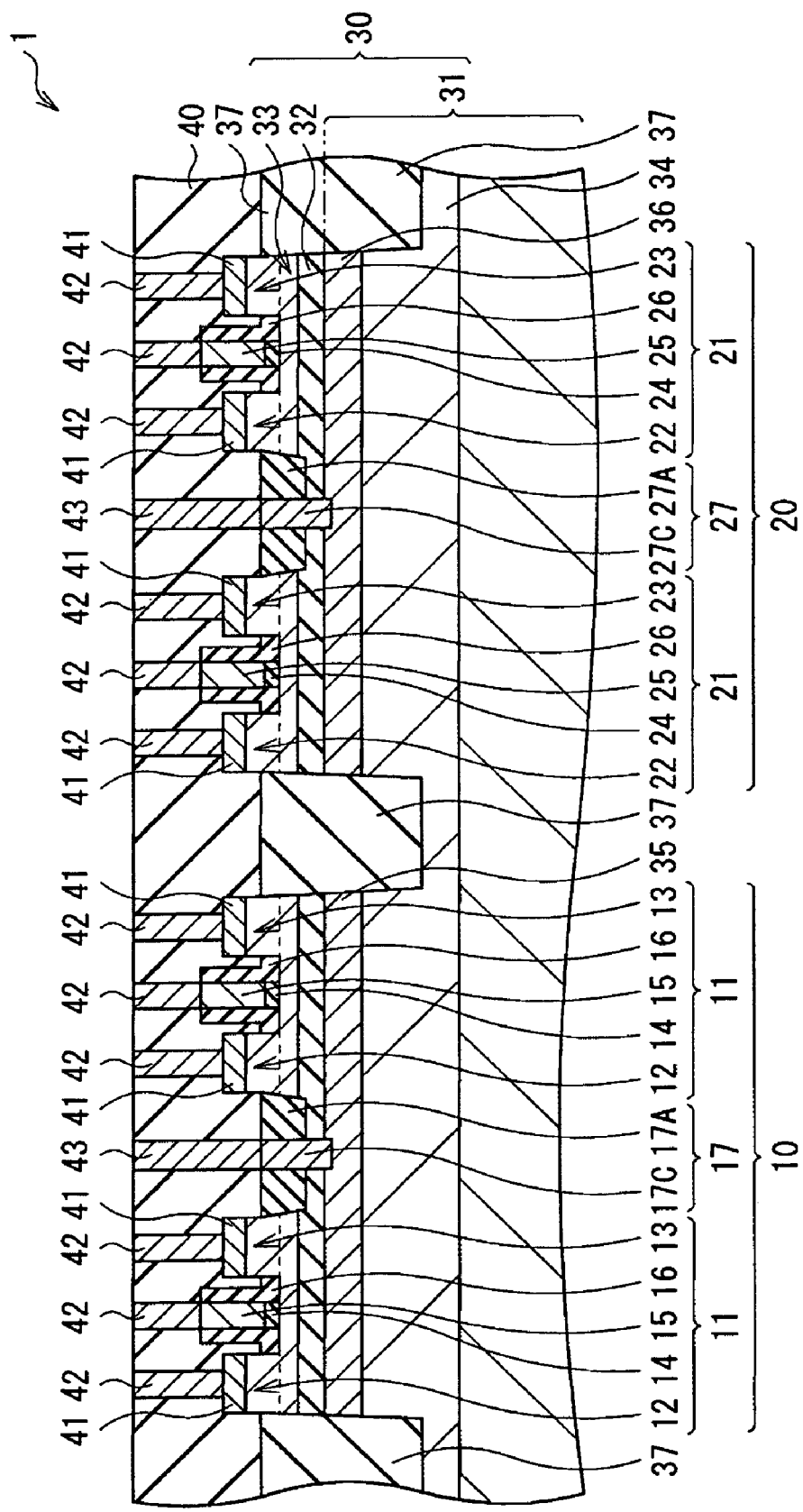
FIG. 7 is a sectional configuration diagram of lead wirings of the semiconductor device of FIG. 1.

FIG. 7 illustrates a sectional configuration of lead wires. The semiconductor device 1 of the embodiment has lead wires as illustrated in, for example, FIG. 7 over the p-type MOS transistor 11 and the n-type MOS transistor 21. Each lead wire is provided in an aperture of an insulating buried layer over the p-type MOS transistor 11 and the n-type MOS transistor 21.

Over the semiconductor layers 12, 13, 22, and 23 functioning as sources or drains, a contact layer 41 for reducing contact resistance with the semiconductor layers 12, 13, 22, and 23 is provided. For example, the contact layer 41 is made of polysilicon containing, in high concentration, impurity of the same conduction type as that of the semiconductor layers 12, 13, 22, and 23 which are in contact. Over the contact layer 41 and the gate electrodes 15 and 25, the contact layer 41 and lead wires 42 which are in contact with the gate electrodes 15 and 25 are provided. Further, over the conduction parts 17C and 27C, lead wires 43 which are in contact with the conduction parts 17C and 27C are provided. The lead wires 42 and 43 are made of a metal material and are constructed by stacking, for example, Ti, TiN, and W in order from the semiconductor substrate 31 side. The lead wires 43 of the embodiment correspond to a concrete example of a "third conduction part" and a "fourth conduction part" of the present invention.

Manufacturing Method

Next, an example of a method of manufacturing the semiconductor device 1 of the embodiment will be described. In the following, the case where an SOI substrate is used as the multilayer substrate 30 and the deep-well layer 34 is provided on the surface of the multilayer substrate 30 will be described.

First, a silicon substrate having, on its surface, the insulating layer 32 having a thickness of about 10 nm and the semiconductor layer 33 having a thickness of about 4 nm is prepared as the multilayer substrate 30. Next, on the multilayer substrate 30 (the semiconductor layer 33), a $SiO_2$ layer 51 having a thickness of about 10 nm and a SiN layer 52 having a thickness of about 20 nm are stacked in this order (FIG. 8A). Subsequently, a resist layer 53 is formed on the entire surface and apertures 53A are formed in correspondence with parts in which the isolation parts 17 and 27 are to be formed in the resist layer 53. After that, using the resist layer 53 as a mask, the multilayer substrate 30 is selectively etched (FIG. 8B). As a result, holes 30A are formed in parts in which the isolation parts 17 and 27 are to be formed. After that, the resist layer 53 is removed.

Next, a resist layer 54 is formed on the entire surface and, after that, apertures 54A are formed in corresponding to parts in which the isolation part 37 is to be formed in the resist layer 54. Subsequently, using the resist layer 54 as a mask, the multilayer substrate 30 is selectively etched (FIG. 9A). By the etching, holes 30B are formed in parts in which the isolation parts 37 are to be formed. After that, the resist layer 54 is removed. The order of forming the holes 30A and 30B may be opposite to the above-described order.

Next, the entire surface of the multilayer substrate is oxidized (surface oxidation), for example, at a temperature of 800 degrees for about 20 minutes and, after that, the holes 30A and 30B are buried with a $SiO_2$ layer (not illustrated). Subsequently, using CMP, the $SiO_2$ layer is planarized until the surface of the SiN layer 52 is exposed. After that, the SiN layer 52 is removed and the $SiO_2$ layer 51 is exposed (FIG. 9B). As a result, the insulation parts 17A and 27A (without the through holes 17B and 27B) made of $SiO_2$ are formed in the hole 30A and, further, the isolation part 37 made of $SiO_2$ is formed in the hole 30B.

Next, in a region in which the impurity layer 35 is to be formed in the surface including the $SiO_2$ layer 51, for example, n-type semiconductor such as P or As is injected under predetermined conditions to form the impurity layer 35 just below the insulating layer 32 (FIG. 10A). In a region in which the impurity layer 36 is to be formed in the surface including the $SiO_2$ layer 51, for example, p-type semiconductor such as B or $BF_2$ is injected under predetermined conditions to form the impurity layer 36 just below the insulting layer 32 (FIG. 10A).

Next, a resist layer 55 is formed on the entire surface. After that, apertures 55A are formed in correspondence with parts in which the through holes 17B and 27B are to be formed in the resist layer 55. Subsequently, using the resist layer 55 as a mask, at least the insulating parts 17A and 27A and the insulating layer 32 are selectively etched (FIG. 10B). As a result, the through hole 17B is formed in the insulation part 17A, and the through hole 27B is formed in the insulation part 27A. After that, the resist layer 55 is removed.

Next, polysilicon is applied on the entire surface including the through holes 17B and 27B and, after that, the polysilicon is left only in the through holes 17B and 27B by using CMP and etching (FIG. 11A). As a result, the conduction parts 17C and 27C are formed and the isolation parts 17 and 27 are formed. As necessary, by using CMP and etching, the height of the isolation parts 17 and 27 is adjusted and the $SiO_2$ layer 51 is removed (FIG. 11B). Subsequently, as necessary, n-type semiconductor such as P or As is injected under predetermined conditions to the conduction part 17C, and p-type semiconductor such as B or $BF_2$ is injected under predetermined conditions to the conduction part 27C, thereby lowering resistance of the conduction parts 17C and 27C.

Figure 12A:
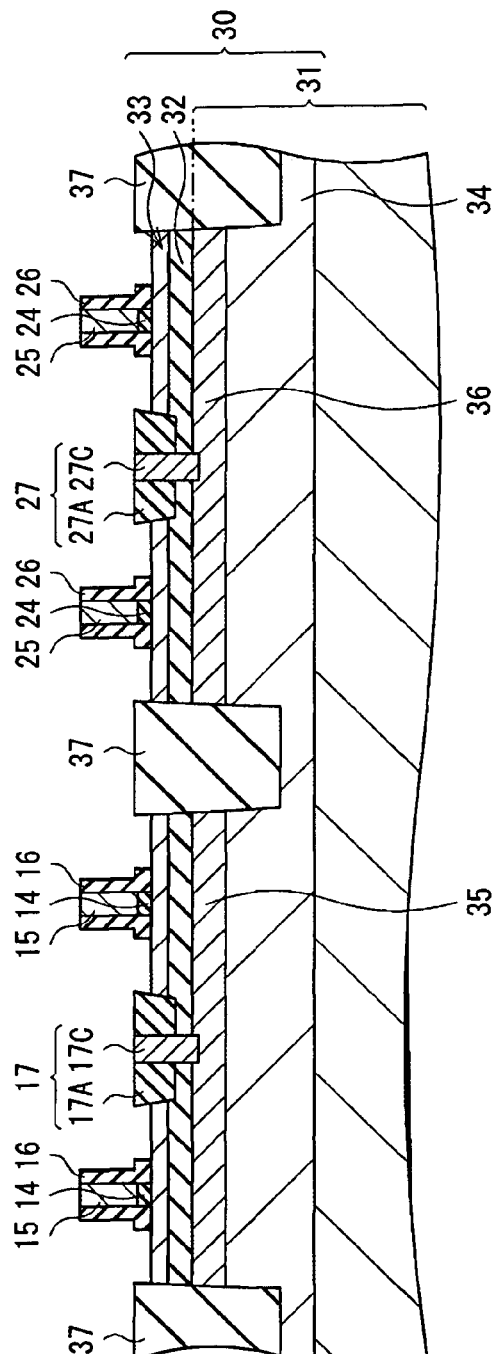
FIGS. 12A and 12B are cross sections for explaining a manufacturing process subsequent to FIG. 11B.
Figure 12B:
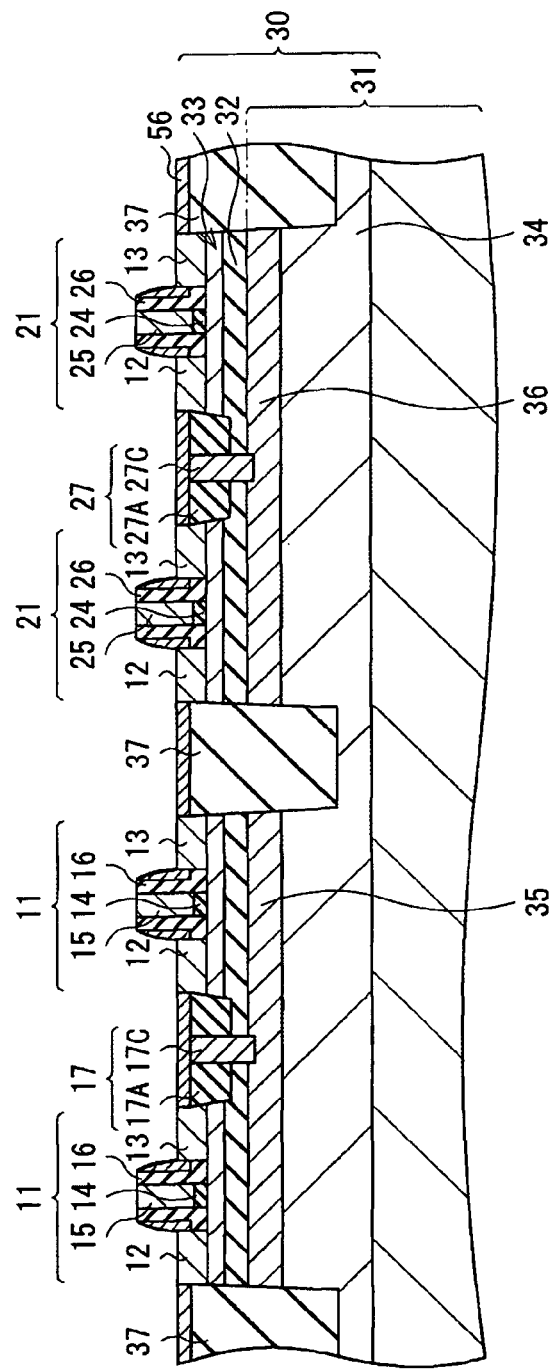

Next, main parts of the MOS transistor are formed. Concretely, the gate insulating films 14 and 24, the gate electrodes 15 and 25, and the sidewalls 16 and 26 are sequentially formed on the surface of the semiconductor layer (FIG. 12A). Subsequently, a protection film 56 having apertures is formed on the surface of the semiconductor layer 33. In the case where the gate electrodes 15 and 25 are made of polysilicon, it is preferable to form the protection film 56 so as to cover the gate electrodes 15 and 25. After that, using the protection film 56 as a mask, a single-crystal silicon layer is formed on the semiconductor layer 33 (FIG. 12B). By the operation, the semiconductor layers 12, 13, 22, and 23 functioning as sources or drains are formed on the semiconductor layer 33. As a result, the p-type MOS transistor 11 and the n-type MOS transistor 21 are formed. After that, the protection film 56 is removed.

Even if the protection film 56 itself is not removed, the protection film 56 does not cause any trouble. Consequently, the protection film 56 may be left as it is. Even if the semiconductor layers 12, 13, 22, and 23 are not formed on the semiconductor layer 33, it is possible to make only the parts exposed on both sides of the gate electrodes 15 and 25 in the semiconductor layer 33 function as the source or drain. However, by forming the semiconductor layers 12, 13, 22, and 23 in the parts exposed on both sides of the gate electrodes 15 and 25 in the semiconductor layer 33 as in the embodiment, parasitic resistance occurring in the source or drain may be reduced.

Finally, the buried layer 40, the contact layer 41, and the lead wires 42 and 43 illustrated in FIG. 7 are formed.

In such a manner, the semiconductor device 1 of the embodiment is manufactured.

Action and Effect

Next, the action and effect of the semiconductor device 1 of the embodiment will be described.

In the semiconductor device 1 of the embodiment, voltage is applied to the gate electrode 15 of the p-type MOS transistor 11 and, simultaneously, positive voltage (positive bias) is applied to the impurity layer 35 (back gate) just below the p-type MOS transistor 11. Voltage is applied to the gate electrode 25 of the n-type MOS transistor 21 and, simultaneously, negative voltage (negative bias) is applied to the impurity layer 36 (back gate) just below the n-type MOS transistor 21. As a result, electric line of force is generated from the gate electrodes 15 and 25 toward the impurity layers 35 and 36, so that the electric field in the vertical direction increases. In the embodiment, the semiconductor layer 33 is thin and has a thickness of a few nm to tens nm, so that the electric field in the lateral direction is small. Therefore, as compared with a semiconductor device of an old type in which a MOS transistor is formed in a single-crystal semiconductor layer of a bulk, the short-channel effect is suppressed.

In the related art, an insulating device isolation structure is not provided between the back gate of a p-type MOS transistor and the back gate of an n-type MOS transistor. Due to this, when positive voltage is applied to the back gate just below the p-type MOS transistor and simultaneously negative voltage is applied to the back gate just below the n-type MOS transistor, current easily flows between the back gate of the p-type MOS transistor and the back gate of the n-type MOS transistor. In the case where the value of this current (leak current) is large, the voltage of the back gate becomes much lower than a desired value. At this time, when the voltage drop in the back gate varies among transistors, the characteristics of the transistors become various. When the voltage of the back gate drops (becomes close to zero volt), the threshold of the gate voltage decreases, so that the action of suppressing the short channel effect decreases.

On the other hand, in the embodiment, the isolation part 37 is formed between the first region 10 in which the p-type MOS transistor 11 is formed and the second region 20 in which the n-type MOS transistor 21 is formed. The isolation part 37 extends along the border between the first and second regions 10 and 20, thereby isolating the first and second regions 10 and 20 from each other. The isolation part 37 also electrically isolates the impurity layers 35 and 36 from each other to a degree that at least current flow between the impurity layers 35 and 36 is interrupted. Consequently, current flow between the back gate of the p-type MOS transistor and the back gate of the n-type MOS transistor is suppressed. As compared with the case where the isolation part 37 is not provided, a voltage drop amount in the back gate is small. As a result, fluctuations in the threshold of the gate voltage are small and, accordingly, variations in the characteristics of the transistors are also small. Since the voltage drop amount of the back gate is small, the threshold of the gate voltage is large. From the above, in the embodiment, both of the short channel effect and fluctuations in the threshold of the gate voltage are allowed to be suppressed.

In the embodiment, a plurality of isolation parts 17 are formed between the p-type MOS transistors 11 adjacent to each other. The isolation part 17 insulation-isolates between the channel region 33A of one p-type MOS transistor 11 and the channel region 33B of another p-type MOS transistor 11. With the configuration, current flow between the channel regions 33A and 33B adjacent to each other is suppressed, so that the p-type MOS transistors 11 are made operate independently of each other. In the embodiment, a plurality of isolation parts 27 are formed between the n-type MOS transistors 21 adjacent to each other. The isolation part 27 insulation-isolates the channel region 33C of one n-type MOS transistor 21 and the channel region 33D of another n-type MOS transistor 21 from each other. Consequently, current flow between the channel regions 33C and 33D adjacent to each other is suppressed, so that the n-type MOS transistors 21 are made operate independently of each other.

In the embodiment, the isolation parts 17 and 27 do not penetrate the impurity layers 35 and 36, and do not have action of increasing a resistance component in the parts just below the isolation parts 17 and 27 in the impurity layers 35 and 36. Further, the isolation parts 17 and 27 are provided with the conduction parts 17C and 27C electrically connected to the impurity layers 35 and 36, respectively, so that voltage is applied from the outside to the impurity layers 35 and 36 via the conduction parts 17C and 27C. With the configuration, no voltage drop occurs in the back gates due to the isolation parts 17 and 27. Therefore, in the embodiment, both of the short channel effect and fluctuations in the threshold are reduced reliably.

Application Example

An application example of the semiconductor device 1 of the embodiment will now be described. In the following, the case of applying the semiconductor device 1 of the embodiment to an SRAM will be described.

Figure 13:
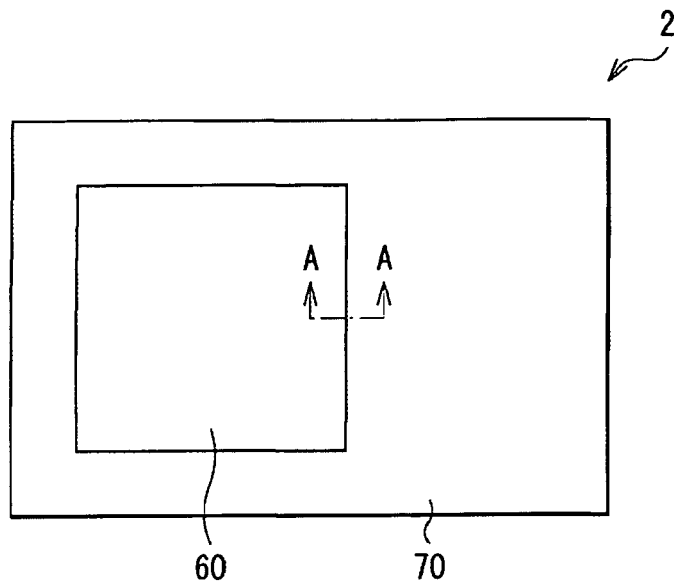
FIG. 13 is a top configuration diagram of a semiconductor device according to an application example of the semiconductor device of FIG. 1.
Figure 14:
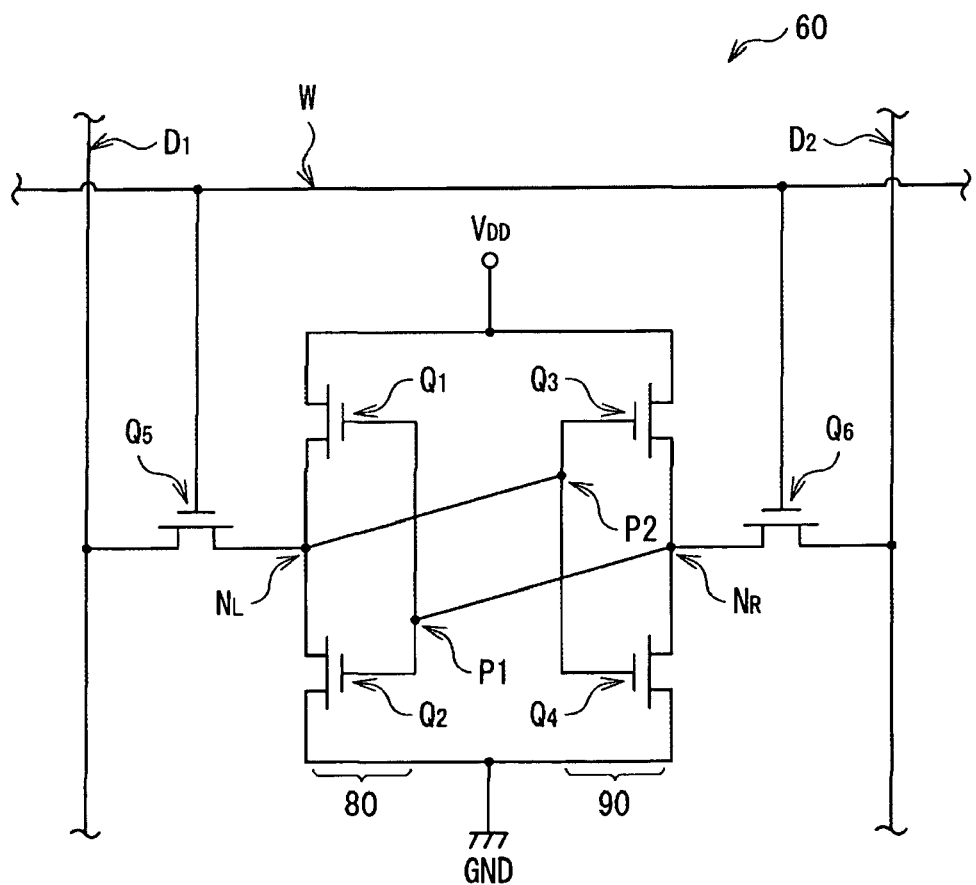
FIG. 14 is a circuit diagram of an SRAM of FIG. 13.

FIG. 13 illustrates an example of the top-view configuration of a semiconductor device 2 according to the application example. The semiconductor device 2 has an SRAM in which memory cells as storage units are disposed in a matrix and a peripheral circuit 70 of the SRAM 60. The SRAM 60 has, for example, a structure in which CMOS inverters 80 and 90 are opposed to each other as illustrated in a circuit diagram of FIG. 14.

In the CMOS inverter 80, the source or drain of a p-type MOS transistor $Q_1$ and the source or drain of an n-type MOS transistor $Q_2$ are connected to each other in series and the resultant is inserted in series between a power supply $V_{DD}$ and a ground GND. The source or drain of the p-type MOS transistor $Q_1$ is connected to the power supply $V_{DD}$ side and the source or drain of the n-type MOS transistor $Q_2$ is connected to the ground GND side. The gate electrodes of the p-type MOS transistor $Q_1$ and the n-type MOS transistor $Q_2$ are connected to each other, and a contact point $P_1$ is connected to a series connection point (right node $N_R$) which will be described later. A series connection point (left node $N_L$) of the source or drain of the p-type MOS transistor $Q_1$ and the source or drain of the n-type MOS transistor $Q_2$ is connected to a connection point $P_2$ which will be described later.

In the CMOS inverter 90, the source or drain of a p-type MOS transistor $Q_3$ and the source or drain of an n-type MOS transistor $Q_4$ are connected to each other in series and the resultant is inserted in series between the power supply $V_{DD}$ and the ground GND. The source or drain of the p-type MOS transistor $Q_3$ is connected to the power supply $V_{DD}$ side and the source or drain of the n-type MOS transistor $Q_4$ is connected to the ground GND side. The gate electrodes of the p-type MOS transistor $Q_3$ and the n-type MOS transistor $Q_4$ are connected to each other, and a contact point $P_2$ is connected to a series connection point (left node $N_L$). A series connection point (right node $N_R$) of the source or drain of the p-type MOS transistor $Q_3$ and the source or drain of the n-type MOS transistor $Q_4$ is connected to a connection point $P_1$ which will be described later.

Further, the left node $N_L$ of the CMOS inverter 80 is connected to the data line $D_1$ via the n-type MOS transistor $Q_5$. The source and drain of the n-type MOS transistor $Q_5$ are connected to the data line $D_1$ and the left node $N_L$, respectively, and the gate of the n-type MOS transistor $Q_5$ is connected to the word line W. On the other hand, the right node $N_R$ of the CMOS inverter 90 is connected to the data line $D_2$ via the n-type MOS transistor $Q_6$. The source and drain of the n-type MOS transistor $Q_6$ are connected to the data line $D_2$ and the right node $N_R$, respectively, and the gate of the n-type MOS transistor $Q_6$ is connected to the word line W.

In the above, the p-type MOS transistors $Q_1$ and $Q_3$ correspond to p-type MOS transistors 11 in the foregoing embodiment, and the n-type MOS transistors $Q_4$ and $Q_5$ correspond to the n-type MOS transistors 12 in the foregoing embodiment. In the following, the p-type MOS transistors $Q_1$ and $Q_3$ will be collectively called p-type MOS transistors 11, and the n-type MOS transistors $Q_4$ and $Q_5$ will be collectively called the n-type MOS transistors 12.

Figure 15:
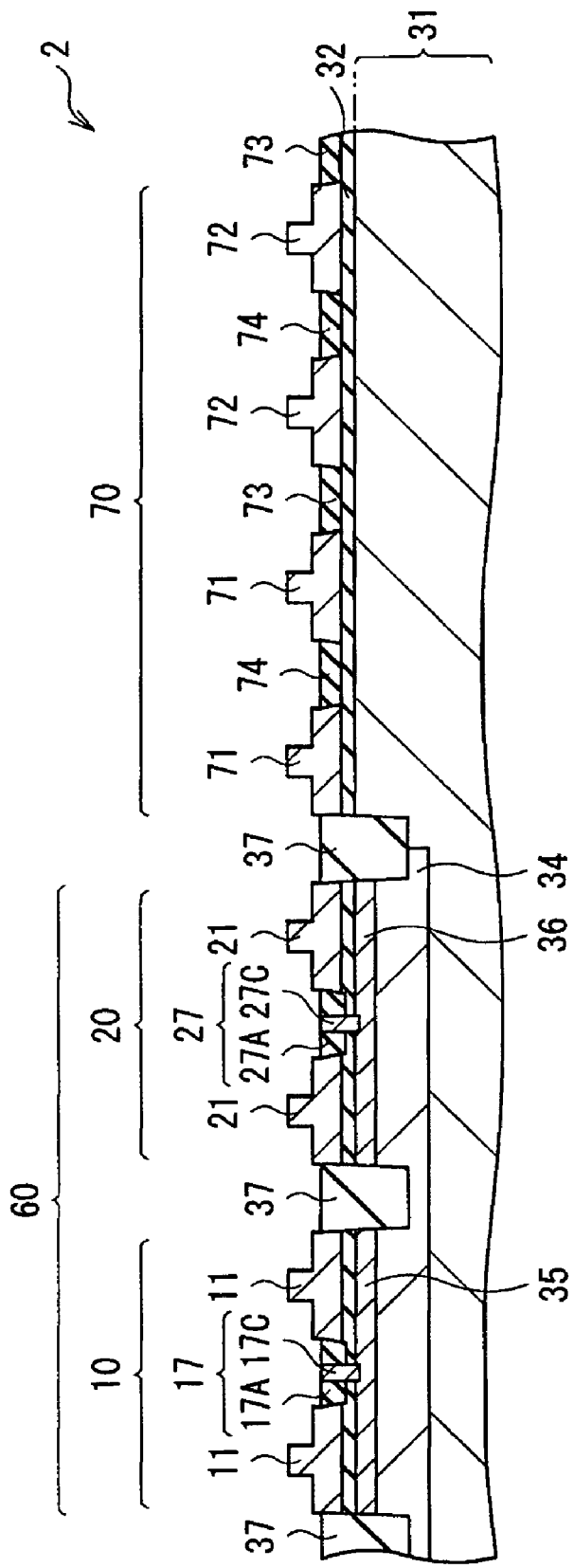
FIG. 15 is a sectional configuration diagram taken along line A-A of the semiconductor device of FIG. 13.

FIG. 15 illustrates an example of a sectional configuration taken along line A-A of the semiconductor device of FIG. 13. In FIG. 15, the internal configuration (the semiconductor layers 33, 12, and 13, the gate insulating film 14, the gate electrode 15, and the side wall 16) of the p-type MOS transistor 11 is not illustrated. Further, in FIG. 15, the internal configuration (the semiconductor layers 33, 22, and 23, the gate insulating film 24, the gate electrode 25, and the side wall 26) of the n-type MOS transistor 21 is not also illustrated.

The peripheral circuit 70 is formed around the SRAM 60. The peripheral circuit 70 has, for example, a p-type MOS transistor 71 having a configuration similar to that of the p-type MOS transistor 11 in the SRAM 60, and an n-type MOS transistor 72 having a configuration similar to that of the n-type MOS transistor 21 in the SRAM 60. The p-type MOS transistor 71 and the n-type MOS transistor 72 are formed on the insulating layer 32.

The peripheral circuit 70 is provided with an isolation part 73 isolating the p-type MOS transistor 71 and the n-type MOS transistor 72 which are adjacent to each other, from each other. Similarly, the peripheral circuit 70 is provided with an isolation part 74 isolating the adjacent p-type MOS transistors 71 from each other and isolating the adjacent n-type MOS transistors 72 from each other. The isolation parts 73 and 74 are formed on the insulating layer 32. That is, FIG. 15 illustrates the case where the peripheral circuit 70 is formed by a design method of the previous generation.

Figure 16:
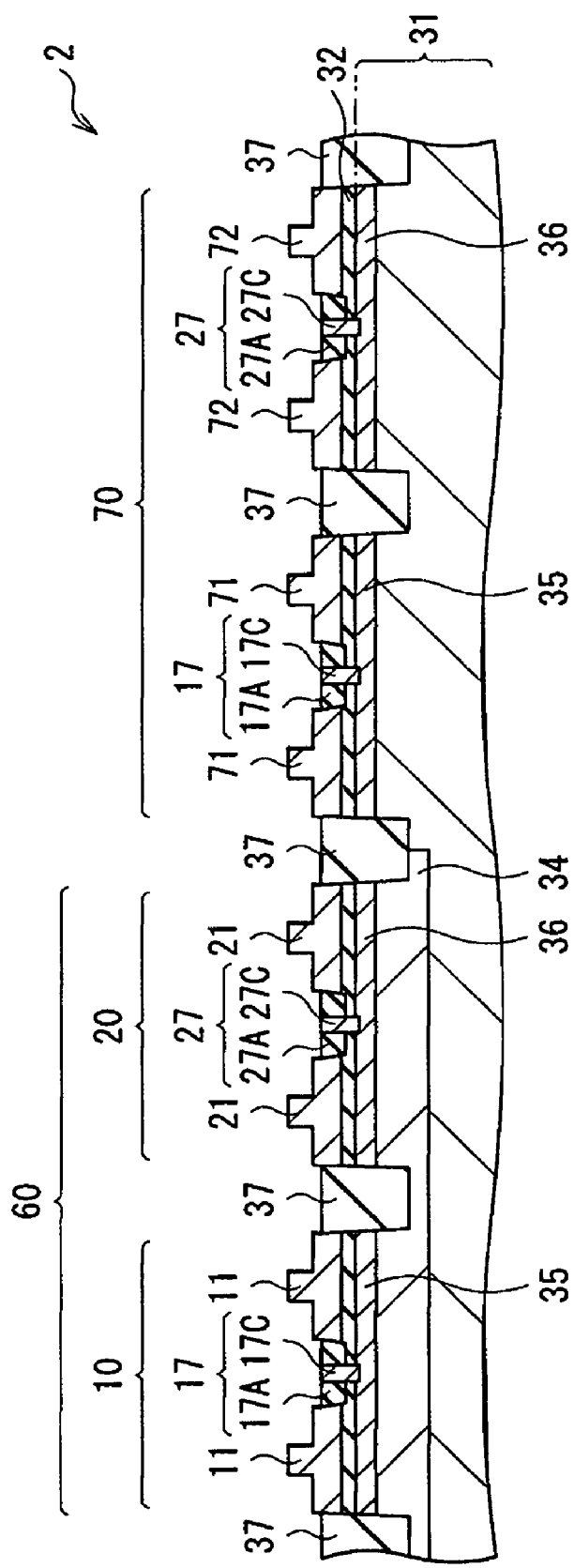
FIG. 16 is a sectional configuration diagram illustrating a modification of the semiconductor device of FIG. 13.

As illustrated in FIG. 16, also in the peripheral circuit 70, like in the SRAM 60, the impurity layer 35 may be provided just below the p-type MOS transistor 71, and the impurity layer 36 may be provided just below the n-type MOS transistor 72. In this case, preferably, as illustrated in FIG. 16, the isolation part 37 is provided in place of the isolation part 73 and the isolation parts 17 and 27 are provided in place of the isolation part 74.

In the application example, in the SRAM 60, the isolation part 37 is formed between the first region 10 in which the p-type MOS transistor 11 is formed and the second region 20 in which the n-type MOS transistor 21 is formed. The isolation part 37 extends along the border between the first and second regions 10 and 20 and isolates the first and second regions 10 and 20 from each other. The isolation part also electrically isolates the impurity layers 35 and 36 from each other to a degree that at least current flowing between the impurity layers 35 and 36 is interrupted. Consequently, in a manner similar to the foregoing embodiment, in the SDRAM 60, both the short channel effect and fluctuation in the threshold of the gate voltage are suppressed.

In the application example, the isolation parts 17 and 27 do not penetrate the impurity layers 35 and 36, and do not have the action of increasing resistance components in parts just below the isolation parts 17 and 27 in the impurity layers 35 and 36. Further, the isolation parts 17 and 27 are provided with the conduction parts 17C and 27C which are electrically connected to the impurity layers 35 and 36, respectively. Via the conduction parts 17C and 27C, voltage may be applied from the outside to the impurity layers 35 and 36. Consequently, in a manner similar to the foregoing embodiment, both the short channel effect and fluctuation in the threshold are reduced with reliability in the SRAM 60.

Although the semiconductor device of the present invention has been described above by using the embodiment, modification, and the application example, the invention is not limited to the embodiment and the like. The configuration of the semiconductor device of the present invention may be freely modified as long as effects similar to those of the foregoing embodiment and the like are obtained.

For example, in the foregoing embodiment and the like, the conduction parts 17C and 27C are formed in the process different from the process of the lead wire 43. They may be formed in the same process as that of the lead wire 43. For example, first, the manufacture is performed until the process illustrated in FIG. 10A. After that, as necessary, the height of the insulation parts 17A and 27A is adjusted by using CMP and etching, and the $SiO_2$ layer 51 is removed (FIG. 17A). Next, the main part of the MOS transistor is formed. Concretely, the gate insulating films 14 and 24, the gate electrodes 15 and 25, and the side walls 16 and 26 are sequentially formed on the surface of the semiconductor layer 33 (FIG. 17B).

Figure 18A:
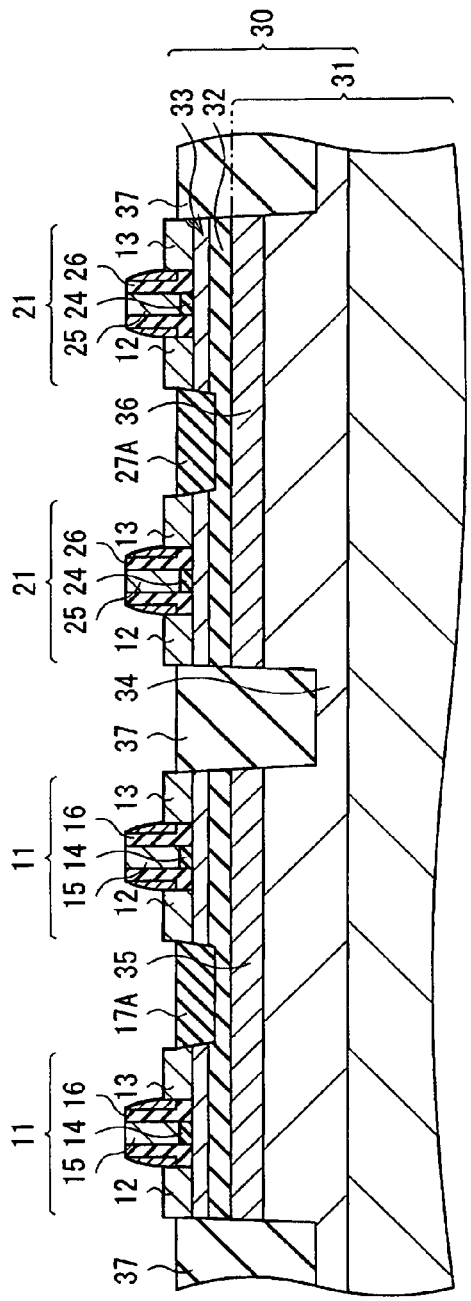
FIGS. 18A and 18B are cross sections for explaining a manufacturing process subsequent to FIG. 17B.

Next, a single-crystal silicon layer is formed on the semiconductor layer 33 (FIG. 18A). By the operation, the semiconductor layers 12, 13, 22, and 23 functioning as the source and drain are formed on the semiconductor layer 33. As a result, the p-type MOS transistor 11 and the n-type MOS transistor 21 are formed. In the case where the gate electrodes 15 and 25 are made of polysilicon, preferably, the protection film 56 having an aperture is formed on the surface of the semiconductor layer 33. After that, using the protection film 56 as a mask, a single-crystal silicon layer is formed on the semiconductor layer 33 and, then the protection film 56 is removed.

Figure 18B:
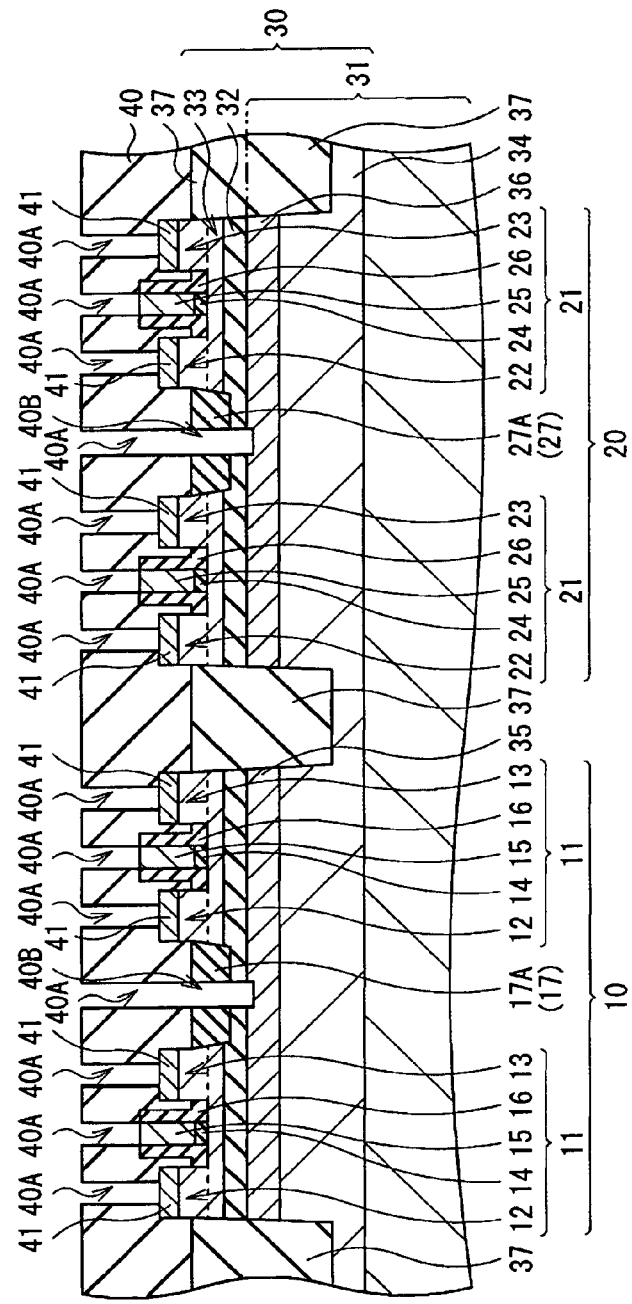

Next, the buried layer 40 obtained by, for example, sequentially stacking a contact etch stopper film (for example, a SiN film having a thickness of about 40 nm) and an interlayer film (a $SiO_2$ film having a thickness of about 100 nm to 150 nm) is formed. Subsequently, apertures 40A are formed just above the gate electrodes 15 and 25, the contact layer 41, and the insulation parts 17A and 27A, in the buried layer (FIG. 18B). Further, via the apertures 40A just above the insulation parts 17A and 27A in the apertures 40A formed in the buried layer 40, apertures 40B are formed in the insulation parts 17A and 27A and the insulation layer 32 (FIG. 18B). After that, in the apertures 40A and 40B, for example, the lead wires 42 and 43 are formed by sequentially stacking Ti, TiN, and W. In such a manner, the conduction parts 17C and 27C are formed together with the lead wires 43 in a lump.

In the case of forming the conduction parts 17C and 27C together with the lead wires 43 in a lump, the number of processes is smaller than that in the case where the conduction parts 17C and 27C are formed in a process different from the lead wires 43. As a result, the semiconductor device is manufactured at low cost. In the case of forming the conduction parts 17C and 27C in a process different from the lead wires 43, at the time of forming a single-crystal silicon layer on the semiconductor layer 33, the protection film 56 protecting the conduction parts 17C and 27C has to be formed. In addition, after formation of the single-crystal silicon layer, the protection film 56 has to be removed. On the other hand, in the modification, in the case where the gate electrodes 15 and 25 are made of a metal material, it is unnecessary to form and remove the protection film 56. Consequently, the number of processes is smaller than that in the case where the conduction parts 17C and 27C are formed in a process different from the lead wires 43. Thus, the semiconductor device 1 is manufactured at low cost.

Although MOS transistors are used as the transistors in the foregoing embodiment and the like, field effect transistors other than the MOS transistors may be used. In the application example, the case of applying the present invention to an SRAM has been described. Obviously, it is also possible to apply the invention to devices other than an SRAM.

Although the case where the semiconductor substrate is a silicon substrate containing a p-type impurity has been described as an example in the foregoing embodiment and the like, it may be a silicon substrate containing an n-type impurity. In this case, the conduction type, which is the p type, of other components is changed to the n type, and the conduction type, which is the n type is changed to the p type. In this case, in the semiconductor devices 1 and 2 in the foregoing embodiment and the like, the p-type MOS transistor is changed to the n-type MOS transistor, and the n-type MOS transistor is changed to the p-type MOS transistor.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a plurality of first transistors formed in a first region in a semiconductor layer in a multilayer substrate having, on a semiconductor substrate, an insulating layer and the semiconductor layer in order from the semiconductor substrate;
   a plurality of second transistors formed in a second region in the semiconductor layer;
   a first impurity layer formed in a region opposed to the first region in the semiconductor substrate;
   a second impurity layer formed in a region opposed to the second region in the semiconductor substrate;
   a first isolation part that isolates the first and second regions from each other and electrically isolates the first and second impurity layers from each other to a degree that at least current flowing between the first and second impurity layers is interrupted;
   a second isolation part which is formed between first transistors adjacent to each other among the plurality of first transistors, penetrates the semiconductor layer, and does not penetrate the first impurity layer; and
   a third isolation part which is formed between second transistors adjacent to each other among the plurality of second transistors, penetrates the semiconductor layer, and does not penetrate the second impurity layer,
   wherein the second isolation part has a first through hole penetrating in a layer stack direction, and a first conduction part formed at least in the first through hole and electrically connected to the first impurity layer, and
   the third isolation part has a second through hole penetrating in the layer stack direction, and a second conduction part formed at least in the second through hole and electrically connected to the second impurity layer.

2. The semiconductor device according to claim 1, wherein the first isolation part penetrates at least between the first and second impurity layers.

3. The semiconductor device according to claim 1, further comprising:
   a third conduction part formed on the second isolation part and in contact with the first conduction part; and
   a fourth conduction part formed on the third isolation part and in contact with the second conduction part.

4. The semiconductor device according to claim 3, wherein the third conduction part is formed together with the first conduction part in a lump, and the fourth conduction part is formed together with the second conduction part in a lump.

5. The semiconductor device according to claim 1, wherein the first transistor is a MOS transistor of a first conduction type,
   the second transistor is a MOS transistor of a second conduction type,
   the first impurity layer mainly contains impurity of the second conduction type, and
   the second impurity layer mainly contains impurity of the first conduction type.

6. The semiconductor device according to claim 1, wherein the insulting layer is a buried insulating layer formed by injecting oxygen ions into the semiconductor substrate, and
   the semiconductor layer is formed on the buried insulating layer with formation of the buried insulating layer.

* * * * *